United States Patent
Adiga et al.

(10) Patent No.: US 11,765,985 B2
(45) Date of Patent: Sep. 19, 2023

(54) SPURIOUS JUNCTION PREVENTION VIA IN-SITU ION MILLING

(71) Applicant: International Business Machines Corporation, Armonk, NY (US)

(72) Inventors: Vivekananda P. Adiga, Ossining, NY (US); Martin O. Sandberg, Ossining, NY (US); Jeng-Bang Yau, Yorktown Heights, NY (US); Keith Fogel, Hopewell Junction, NY (US); John Bruley, Poughkeepsie, NY (US); Markus Brink, White Plains, NY (US); Benjamin Wymore, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 33 days.

(21) Appl. No.: 16/908,120

(22) Filed: Jun. 22, 2020

(65) Prior Publication Data
US 2021/0399199 A1    Dec. 23, 2021

(51) Int. Cl.
*H10N 60/01*     (2023.01)
*H10N 60/12*     (2023.01)
*H10N 60/80*     (2023.01)

(52) U.S. Cl.
CPC ......... *H10N 60/0912* (2023.02); *H10N 60/12* (2023.02); *H10N 60/805* (2023.02)

(58) Field of Classification Search
CPC .. H01L 39/2493; H01L 39/025; H01L 39/223
See application file for complete search history.

(56) References Cited

U.S. PATENT DOCUMENTS

| 10,403,809 B2 | 9/2019 | Krogstrup et al. |
| 10,573,685 B1 | 2/2020 | Adiga et al. |

(Continued)

FOREIGN PATENT DOCUMENTS

| WO | 2019032115 | 2/2019 |

OTHER PUBLICATIONS

Osman, Amr. "Reliability and reproducibility of Josephson junction fabrication—Steps towards an optimized process." (2019) (Year: 2019).*

(Continued)

*Primary Examiner* — Aaron J Gray
(74) *Attorney, Agent, or Firm* — Amin, Turocy & Watson, LLP

(57) ABSTRACT

Systems and techniques that facilitate spurious junction prevention via in-situ ion milling are provided. In various embodiments, a method can comprise forming a tunnel barrier of a Josephson junction on a substrate during a shadow evaporation process. In various instances, the method can further comprise etching an exposed portion of the tunnel barrier during the shadow evaporation process. In various embodiments, the shadow evaporation process can comprise patterning a resist stack onto the substrate. In various instances, the etching the exposed portion of the tunnel barrier can leave a protected portion of the tunnel barrier within a shadow of the resist stack. In various instances, the shadow of the resist stack can be based on a direction of the etching the exposed portion of the tunnel barrier. In various embodiments, the shadow evaporation process can further comprise depositing a first superconducting material on the substrate after the patterning the resist stack, oxidizing a surface of the first superconducting material to form the tunnel barrier, and depositing a second superconducting material over the protected portion of the (Continued)

tunnel barrier to form a Josephson junction. In various instances, the etching the exposed portion of the tunnel barrier can occur after the oxidizing the surface of the first superconducting material and before the depositing the second superconducting material.

11 Claims, 13 Drawing Sheets

(56) References Cited

U.S. PATENT DOCUMENTS

| | | | |
|---|---|---|---|
| 10,629,798 B1 | 4/2020 | Kallaher et al. | |
| 2004/0056335 A1* | 3/2004 | Aoyagi | H10N 69/00 257/661 |
| 2019/0042967 A1 | 2/2019 | Yoscovits et al. | |
| 2019/0273196 A1 | 9/2019 | Marcus et al. | |
| 2020/0019068 A1 | 1/2020 | Brink et al. | |
| 2020/0028064 A1 | 1/2020 | Chang et al. | |
| 2021/0336121 A1* | 10/2021 | Burkett | H10N 60/0912 |

OTHER PUBLICATIONS

Dunsworth et al., "Characterization and Reduction of Capacitive Loss Induced by Sub-Micron Josephson Junction Fabrication in Superconducting Qubits," Applied Physics Letters 111, 022601, arXiv:1706.00879v1 [quant-ph], Jun. 3, 2017, 9 pages.

Grunhaupt et al., "An argon ion beam milling process for native AlOx layers enabling coherent superconducting contacts," Applied Physics Letters 111, 072601, 2017, 5 pages.

Wu et al., "Overlap junctions for high coherence superconducting qubits," Applied Physics Letters 111, 032602, arXiv:1705.08993v1 [cond-mat.supr-con], 2017, 3 pages.

Lecocq et al., "Junction fabrication by shadow evaporation without a suspended bridge," Nanotechnology 22, 315302, Jul. 8, 2011, 6 pages.

Dolan et al., "Very small (> 20 nm) lithographic wires, dots, rings, and tunnel junctions," Physica B 152, 1988, 7 pages.

Dolan, "Offset masks for liftoff photoprocessing," Applied Physics Letters 31, 337, 1977, 3 pages.

Potts et al., "CMOS compatible fabrication methods for submicron Josephson junction qubits," IEE Proceedings—Science Measurement and Technology, vol. 148, Issue 5, 2001, 4 pages.

* cited by examiner

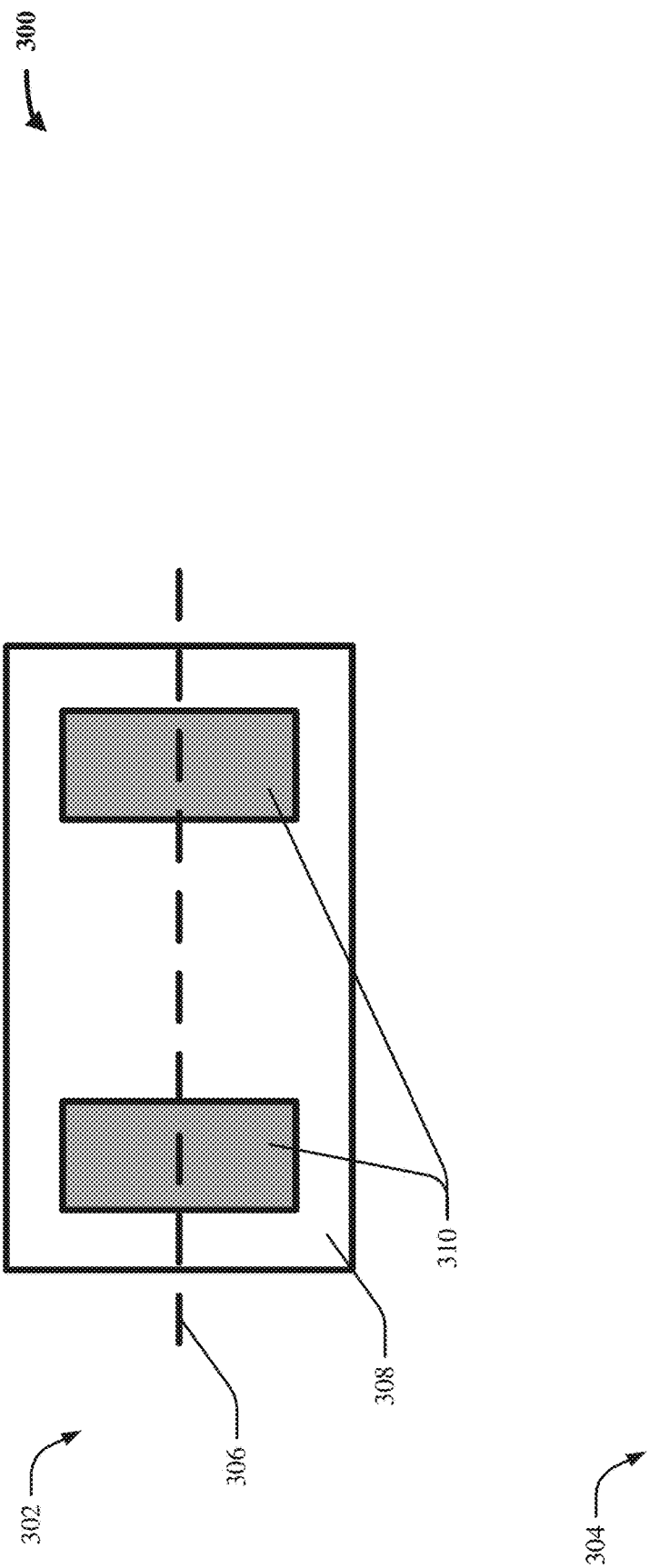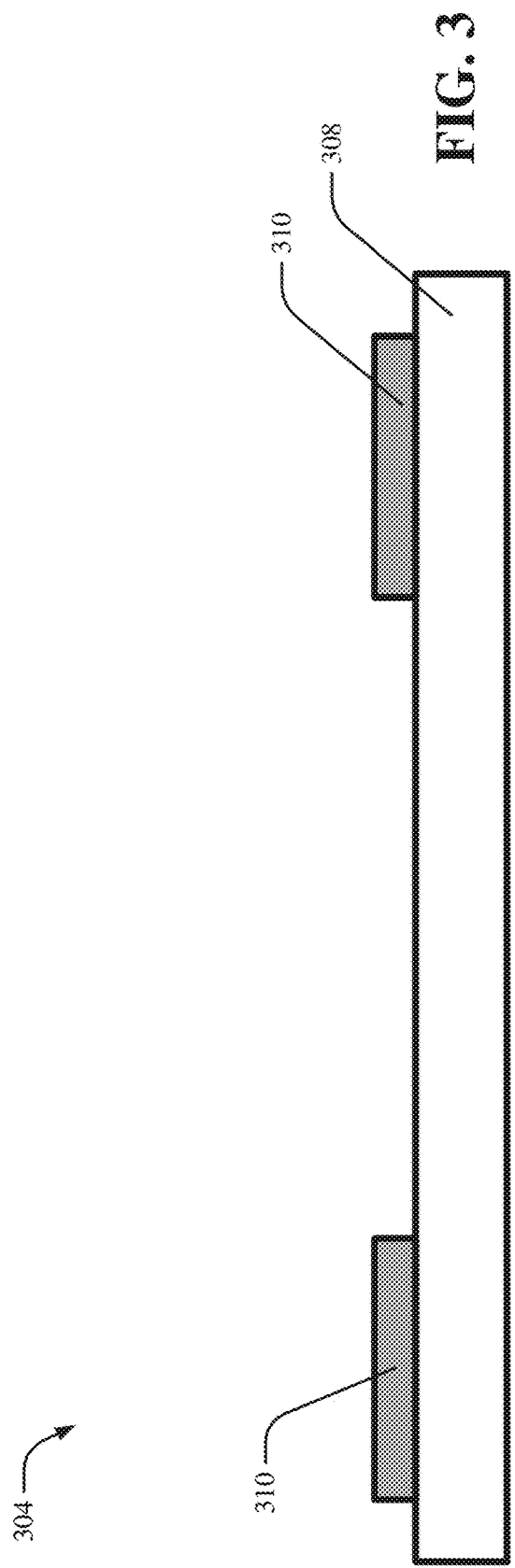
FIG. 3

SPURIOUS JUNCTION PREVENTION VIA IN-SITU ION MILLING

BACKGROUND

The subject disclosure relates generally to Josephson junction fabrication, and more specifically to Josephson junction fabrication without spurious junctions via in-situ ion milling.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate spurious junction prevention via in-situ ion milling are described.

According to one or more embodiments, a method is provided. The method can comprise forming a tunnel barrier of a Josephson junction on a substrate during a shadow evaporation process. In various instances, the method can further comprise etching an exposed portion of the tunnel barrier during the shadow evaporation process. In various embodiments, the shadow evaporation process can comprise patterning a resist stack onto the substrate. In various instances, the etching the exposed portion of the tunnel barrier can leave a protected portion of the tunnel barrier within a shadow of the resist stack. In various aspects, the shadow of the resist stack can be based on a direction of the etching the exposed portion. In various embodiments, the shadow evaporation process can further comprise depositing a first superconducting material on the substrate after the patterning the resist stack, oxidizing a surface of the first superconducting material to form the tunnel barrier, and depositing a second superconducting material over the protected portion of the tunnel barrier to form the Josephson junction. In various instances, the etching the exposed portion of the tunnel barrier can occur after the oxidizing the surface of the first superconducting material and before the depositing the second superconducting material.

According to one or more embodiments, a method is provided. The method can comprise patterning a bi-layer resist stack on a substrate. In various instances, the method can further comprise forming a junction barrier layer on a first superconductor on the substrate during a shadow evaporation technique. In various instances, the method can further comprise directionally etching a first portion of the junction barrier layer during the shadow evaporation technique. In various instances, the first portion of the junction barrier layer can be outside of a shadow cast by the bi-layer resist stack. In various embodiments, the directionally etching the first portion of the junction barrier layer can cause a second portion of the junction barrier layer to remain on the substrate. In various aspects, the second portion of the junction barrier layer can be inside the shadow cast by the bi-layer resist stack. In various embodiments, the shadow evaporation technique can comprise evaporating the first superconductor onto the substrate, oxidizing a surface of the first superconductor to form the junction barrier layer, and evaporating a second superconductor over the second portion of the junction barrier layer. In various instances, the directionally etching the first portion of the junction barrier layer can occur after the oxidizing the surface of the first superconductor and before the evaporating the second superconductor.

According to one or more embodiments, a device is provided. The device can comprise a first superconducting layer on a substrate. In various instances, the first superconducting layer can have a first portion and a second portion. In various aspects, the device can further comprise a tunnel barrier layer that can be on the first portion of the first superconducting layer. In various instances, the device can further comprise a second superconducting layer that can have a third portion that is on the tunnel barrier layer. In various aspects, the second superconducting layer can have a fourth portion that is on the second portion of the first superconducting layer. In various embodiments, the second portion of the first superconducting layer and the fourth portion of the second superconducting layer can be in ohmic contact. In various embodiments, the first portion of the first superconducting layer, the tunnel barrier layer, and the third portion of the second superconducting layer can form a primary Josephson junction.

DESCRIPTION OF THE DRAWINGS

FIG. 3 illustrates a block diagram of an example, non-limiting intermediate substrate structure in accordance with one or more embodiments described herein.

DETAILED DESCRIPTION

Figure 1:
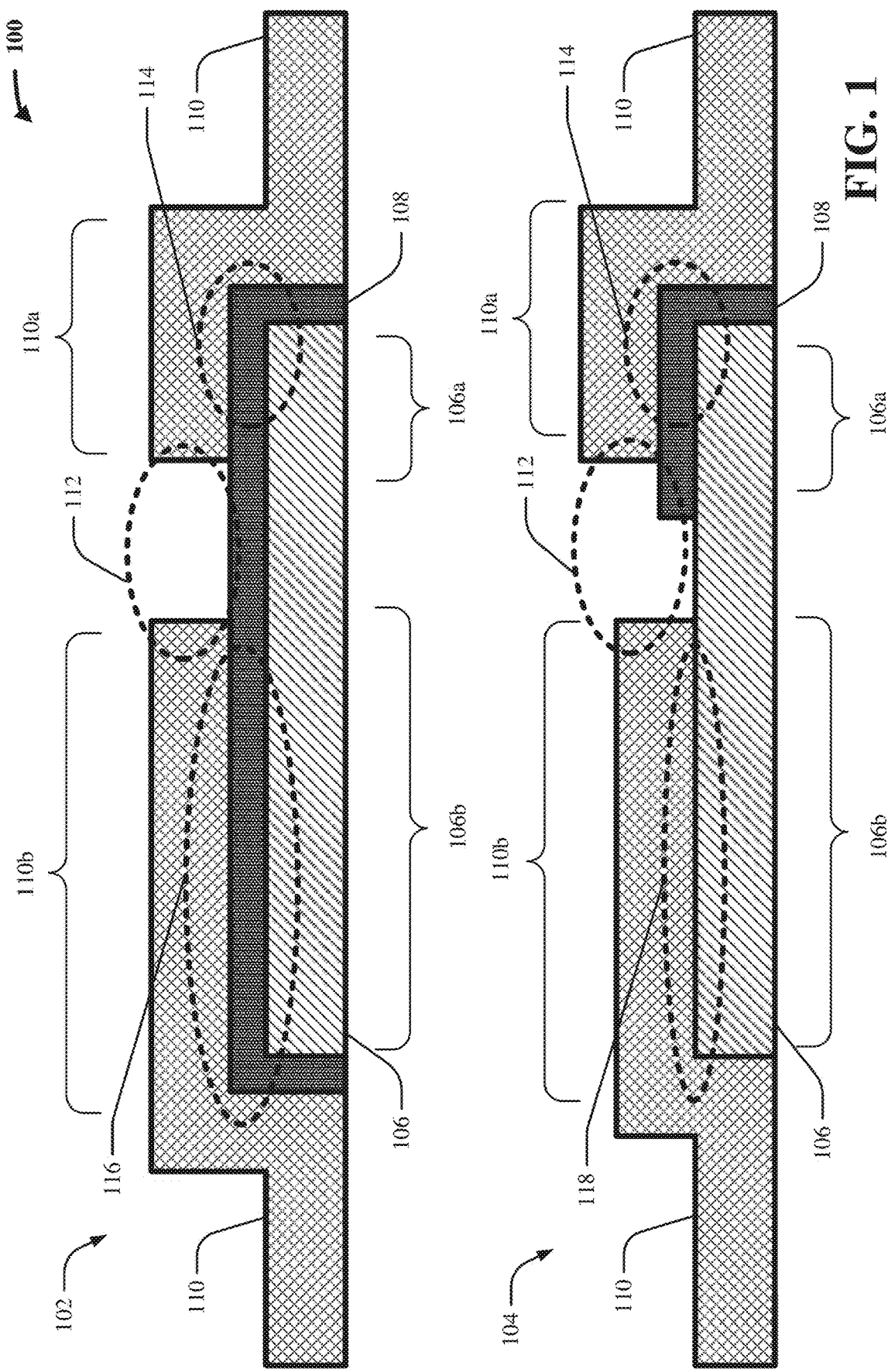
FIG. 1 illustrates a block diagram of example, non-limiting Josephson junction structures in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Josephson junctions are one of the fundamental building blocks of superconducting electronics. They are used in applications such as Rapid Single Flux Quanta (RSFQ) digital electronics, they are the foundation for the voltage standard, and they are the main element of superconducting qubits. A Josephson junction is a weak link between two superconducting electrodes where the tunneling of Cooper pairs is governed by the Josephson relations. Josephson junctions, also called tunnel junctions, can be manufactured by shadow evaporation processes (e.g., deposition techniques that leverage resist profile shadows to selectively deposit layers of materials on a substrate from one or more angles). In various instances, a shadow evaporation process can include a first deposition/evaporation, an intermediate oxidation, and a second deposition/evaporation. Although shadow evaporation processes can create a primary Josephson junction on a substrate, a disadvantage of shadow evaporation processes is that they can also result in the creation of one or more spurious junctions on the substrate (e.g., one or more secondary, extra, and/or unintended Josephson junctions in addition to the primary Josephson junction). Spurious junctions can reduce the effectiveness and/or performance of, for instance, quantum computing systems.

In some cases, the negative effects of spurious junctions can be mitigated by shorting the spurious junctions (e.g., via a bandage process that connects a top superconducting layer of a spurious junction to the capacitor pads that shunt the primary Josephson junction). However, this can require additional depositions and/or post-fabrication steps (e.g., extra cost) and can negatively affect the performance of the quantum computing system (e.g., decreased yield, accelerated junction aging).

Various embodiments of the invention can address one or more of these problems. In various aspects, embodiments of the invention can prevent the formation of spurious junctions during shadow evaporation processes. In various instances, embodiments of the invention can be implemented as modified microfabrication and/or nanofabrication processes that can facilitate the manufacture and/or formation of one or more primary Josephson junctions on a substrate and that can prevent the manufacture and/or formation of one or more spurious junctions on the substrate. By preventing the formation of spurious junctions, embodiments of the invention can facilitate the creation of improved quantum computing systems without requiring expensive and/or time-consuming fabrication steps and/or post-fabrication steps.

In various instances, embodiments of the invention can be implemented as a modified shadow evaporation methodology. In various aspects, the modified shadow evaporation methodology can include spinning and/or baking one or more resist layers (e.g., methyl methacrylate (MMA) and/or poly methyl methacrylate (PMMA)) onto a substrate (e.g., a silicon substrate). In various aspects, the modified shadow evaporation methodology can include defining in the one or more resist layers one or more circuit elements of, for instance, a quantum computing system. Non-limiting examples of such circuit elements can include capacitors, inductors, distributed elements, resonators, waveguides, and/or coupling elements. In various instances, such circuit elements can be defined by one or more lithography steps (e.g., any suitable lithography steps such as electron beam lithography and/or optical lithography). In various aspects, the modified shadow evaporation methodology can include forming the lithographically-defined circuit elements on the substrate by any suitable subtractive processes (e.g., etching) and/or additive processes (e.g., lift-off). That is, in various instances, the one or more resist layers can be removed from the substrate.

In various aspects, after the circuit elements are formed on the substrate, it can be desired to form one or more tunnel junctions (e.g., Josephson junctions) on the substrate. In various cases, the modified shadow evaporation methodology can include spinning and/or baking one or more other resist layers (e.g., MMA and/or PMMA) onto the substrate. In various instances, the modified shadow evaporation methodology can include defining in the one or more other resist layers one or more tunnel junctions (e.g., defining resist bridges and/or resist trenches in which the tunnel junctions can be formed during subsequent deposition/evaporation steps) via any suitable lithography technique (e.g., electron beam lithography and/or optical lithography). In various instances, the modified shadow evaporation methodology can include a first deposition step during which a first superconductor (e.g., aluminum) is evaporated onto the substrate from a first direction/angle (e.g., the first superconductor can be evaporated into the trenches of the one or more other resist layers). In various instances, the modified shadow evaporation methodology can include an oxidation step which can cause the surface of the first superconductor to form into an oxidized layer.

In various aspects, the modified shadow evaporation methodology can include an in-situ ion milling step which can cause an exposed portion (e.g., an undesired portion) of the oxidized layer to be removed from the substrate (e.g., to be removed from the surface of the first superconductor) and which can cause a protected portion (e.g., a desired portion) of the oxidized layer to remain on the substrate (e.g., to remain on the surface of the first superconductor). In various instances, a direction of the in-situ ion milling step can cause the one or more other resist layers to cast a shadow onto the substrate (e.g., the one or more other resist layers can project a shadow in and/or along the direction of the in-situ ion milling). In various cases, the exposed/undesired portion of the oxidized layer can be that part of the oxidized layer that is outside of and/or not covered by the shadow that is cast by the one or more other resist layers (e.g., the exposed/undesired portion of the oxidized layer can be unprotected by the shadow of the one or more other resist layers). In various cases, the protected/desired portion of the oxidized layer can be that part of the oxidized layer that is within and/or covered by the shadow that is cast by the one or more other resist layers (e.g., the protected/desired portion of the oxidized layer can be protected by the shadow of the one or more other resist layers).

In some cases, the one or more other resist layers can include a suspended resist bridge (e.g., also referred to as a suspended evaporation bridge), and the protected portion of the oxidized layer can be beneath and/or under the suspended resist bridge (e.g., when ion milling is performed in a top-down direction, the suspended resist bridge can cast a shadow downward, which can protect the part of the oxidized layer that is under and/or beneath the suspended resist bridge). In some cases, the one or more other resist layers can be bridgeless, and the protected portion of the oxidized layer can be covered by a shadow that is cast by one or more walls of the one or more other resist layers (e.g., when ion milling is performed at a glancing angle, a wall/profile of the one or more other resist layers can cast a shadow in the direction of the glancing angle). In various aspects, the one or more shadows cast by the one or more other resist layers can depend upon a geometry, topography, and/or topology of the one or more other resist layers as well as upon a direction of the ion milling. In some cases, in-situ ion milling can be performed at a glancing angle even when the one or more other resist layers include a suspended resist bridge (e.g., the suspended resist bridge can cast a shadow in the direction of the glancing angle). In various aspects, the shadow of the one or more other resist layers can be cast and/or projected in the direction of the in-situ ion milling.

In various instances, the direction of the in-situ ion milling can be selected, controlled, and/or chosen based on the bridges and/or trenches that are defined in the one or more other resist layers, and/or based on a location on the substrate at which a primary tunnel junction (e.g., a primary Josephson junction) is desired. That is, in various aspects, a direction of the in-situ ion milling can be controlled (e.g., the ion milling can be aimed) so that the geometry, topography, and/or topology of the one or more other resist layers projects a shadow onto the location on the substrate at which a primary tunnel junction is desired. When a shadow of the one or more other resist layers is projected onto the location at which a primary tunnel junction is desired, the oxidized layer at that location (e.g., the protected/desired portion of the oxidized layer) can be not removed during the in-situ ion milling (e.g., the direction of the in-situ ion milling can be controlled/aimed so that the shadow cast by the one or more other resist layers can be positioned over, and thus can protect, the part of the oxidized layer that is desired to serve as the tunnel barrier in the primary tunnel junction). However, the oxidized layer at other locations (e.g., the exposed/undesired portion of the oxidized layer) on the substrate that are not within the shadow cast by the one or more other resist layers can be removed during the in-situ ion milling (e.g., the direction of the in-situ ion milling can be controlled/aimed so that the shadow cast by the one or more other resist layers can be not positioned over, and thus cannot protect, the part of the oxidized layer that is not desired to serve as the tunnel barrier in the primary tunnel junction). In this way, the part of the oxidized layer that is at the location at which the primary tunnel junction is desired (e.g., the protected/desired portion of the oxidized layer) can be maintained on the substrate (e.g., maintained on the surface of the first superconductor), and the part of the oxidized layer that is at a location other than the location at which the primary tunnel junction is desired (e.g., the exposed/undesired portion of the oxidized layer) can be removed from the substrate (e.g., removed from the surface of the first superconductor). In various aspects, the in-situ ion milling can be performed one or more times at one or more angles and/or in one or more directions in order to remove the exposed/undesired portion of the oxidized layer without removing the protected/desired portion of the oxidized layer.

In various instances, the modified shadow evaporation methodology can include a second deposition step during which a second superconductor (e.g., aluminum) is evaporated onto the substrate from a second direction/angle. In various aspects, the second direction/angle can be controlled and/or aimed so that the second superconductor is deposited and/or evaporated onto the protected/desired portion of the oxidized layer. In various instances, the modified shadow evaporation methodology can include an etching and/or lift-off step to remove the one or more other resist layers. In various cases, the first superconductor, the protected/desired portion of the oxidized layer, and the second superconductor can form a primary tunnel junction.

In some cases, the modified shadow evaporation methodology can also include an ion milling step before the first deposition/evaporation, so as to improve and/or ensure ohmic contact between the previously-formed circuit elements and the tunnel junctions to be formed by the two depositions and intermediate oxidation.

In various embodiments, because the exposed portion of the oxidized layer can be removed via the in-situ ion milling step, the substrate (e.g., the circuit on the substrate) can lack spurious junctions. In various aspects, a spurious junction can form when some part of the second superconductor is evaporated onto some part of the oxidized layer that is at a location other than the location at which the primary tunnel junction is desired. That is, a spurious junction can be formed when a part of the second superconductor is deposited and/or evaporated onto the exposed/undesired portion of the oxidized layer. By removing the exposed/undesired portion of the oxidized layer, the in-situ ion milling step can prevent the second deposition from forming spurious junctions. As mentioned above, in various aspects, the direction of the in-situ ion milling can be based on the geometry, topography, and/or topology of the one or more other resist layers and can be based on the location at which a primary tunnel junction is desired. In other words, in some cases, the in-situ ion milling can be aimed so that the one or more other resist layers project a shadow onto the location at which the primary tunnel junction is desired (e.g., can be aimed so that the one or more other resist layers cast a shadow onto the protected/desired portion of the oxidized layer). Moreover, in some cases, the in-situ ion milling can be aimed so that the one or more other resist layers do not project a shadow onto locations other than the location at which the primary tunnel junction is desired (e.g., can be aimed so that the one or more other resist layers do not cast a shadow onto the exposed/undesired portion of the oxidized layer). Because the exposed/undesired portion of the oxidized layer is not protected by the shadow and because the protected/desired portion of the oxidized layer is protected by the shadow, the in-situ ion milling can remove from the substrate (e.g., can remove from the surface of the first superconductor) the exposed/undesired portion of the oxidized layer and can leave on the substrate (e.g., can leave on the surface of the first superconductor) the protected/desired portion of the oxidized layer. Since the ion-milling removes the exposed/undesired portion of the oxidized layer, the exposed/undesired portion is no longer on the substrate (e.g., is no longer on the surface of the first superconductor) and thus cannot be used to form a spurious junction during the second deposition. Without such an in-situ ion milling step, however, the exposed/undesired portion of the oxidized layer would remain on the substrate (e.g., would remain on the surface of the first superconductor) and thus spurious junctions would be able to form during the second deposition (e.g., the part of the oxidized layer that is at a location other than the location at which the primary tunnel junction is desired would not be removed from the substrate and could be subsequently covered by the second superconductor during the second deposition/evaporation, thereby forming a spurious junction).

In various aspects, embodiments of the invention can comprise a method of fabricating Josephson junctions without spurious junctions. In various instances, the method can comprise forming a tunnel barrier of a Josephson junction (e.g., such as through oxidation) on a first superconducting layer on a substrate during a shadow evaporation process. In various aspects, the method can further comprise removing (e.g., such as through ion milling and/or any other suitable directional etching technique) an exposed/undesired portion of the tunnel barrier during the shadow evaporation process. In various cases, the shadow evaporation process can include patterning a resist stack (e.g., a resist mask) onto the substrate. In various instances, the removing the exposed portion of the tunnel barrier can leave a protected portion of the tunnel barrier within a shadow cast and/or projected by the resist stack. In various embodiments, the shadow evaporation process can further comprise depositing a first superconducting material from a primary angle on the substrate after the patterning the resist stack, oxidizing a surface of the first superconducting material to form the tunnel barrier, and depositing a second superconducting material from a secondary angle over the tunnel barrier to form the Josephson junction. In various cases, due to the geometry, topography, and/or topology of the resist stack, a shadowing effect can occur when the two superconducting layers are deposited. The shadowing effect can be used to define the extent of the Josephson junction and can be used to section up the superconducting layers. In various cases, the removing the exposed portion of the tunnel barrier can occur after the oxidizing the surface of the first superconducting material and before the depositing the second superconducting material.

In various instances, embodiments of the invention can be implemented as an in-situ ion milling step during a shadow evaporation process. In various aspects, the shadow evaporation process can make use of a resist profile (e.g., a bi-layer resist stack) and can comprise depositing a first superconductor on a substrate, oxidizing the surface of the first superconductor to form an oxidized layer (e.g., a tunnel barrier and/or junction tunnel barrier), and depositing a second superconductor on the oxidized layer. That is, the shadow evaporation process can involve two depositions and an intermediate oxidation. In various instances, a primary tunnel junction (e.g., a stack comprising the first superconductor, the oxidized layer, and the second superconductor) can be desired at a particular location on the substrate. This can be referred to as the desired location. Locations other than the desired location can be referred to as undesired locations. In various instances, a spurious junction can be a stack comprising the first superconductor, the oxidized layer, and the second superconductor at an undesired location on the substrate. In various instances, if the second deposition immediately follows the intermediate oxidation, spurious junctions can be formed. Specifically, in various cases, the intermediate oxidation can result in the formation of the oxidized layer at one or more undesired locations, and the second deposition can result in the formation of the second superconductor on top of the oxidized layer at the one or more undesired locations. In other words, stacks comprising the first superconductor, the oxidized layer, and the second superconductor can be formed at the one or more undesired locations, meaning that spurious junctions can be formed. In various cases, an in-situ ion milling step can be performed after the intermediate oxidation and before the second deposition in order to prevent the formation of such spurious junctions. In various instances, such an in-situ ion milling step can remove and/or etch away the oxidized layer at the undesired locations (e.g., portions of the oxidized layer that are not protected by a shadow cast by the resist profile can be removed from the substrate by the ion milling). In various instances, such an in-situ ion milling step can leave on the substrate (e.g., can leave on the surface of the first superconductor) the oxidized layer at the desired location (e.g., portions of the oxidized layer that are protected by a shadow cast by the resist profile can remain on the substrate during the ion milling). Because the in-situ ion milling step can remove the oxidized layer from the undesired locations and can leave the oxidized layer at the desired location, spurious junctions cannot form at the undesired locations during the second deposition (e.g., when the oxidized layer is removed from the undesired locations, the second deposition can simply deposit the second superconductor onto the first superconductor (or some other circuit feature) at the undesired locations, which does not form a tunnel junction). In this way, various embodiments of the invention can prevent the formation of spurious junctions.

In various embodiments, a direction of the in-situ ion milling can be a function of the desired location, the undesired locations, and the geometry, topography, and/or topology of the resist profile used during the shadow evaporation process. As mentioned above, a direction of the in-situ ion milling can cause the resist profile used during the shadow evaporation process to cast a shadow on the substrate (e.g., to project a shadow in the direction of the ion milling). The shape, size, and/or location of the shadow can depend on the geometry and/or defined features of the resist profile (e.g., can depend on dimensions and/or locations of the bridges and/or trenches that are patterned into the resist profile). Based on the geometry of the resist profile, the desired location, and the undesired location, an ion milling direction can, in various instances, be determined and/or selected such that the shadow of the resist profile is projected onto the desired location and not onto the undesired locations. In such case, the oxidized layer in the undesired locations can be unprotected by the shadow of the resist profile, and the oxidized layer in the desired location can be protected by the shadow of the resist profile. Thus, in various cases, the in-situ ion milling can remove from the substrate (e.g., remove from the surface of the first superconductor) the oxidized layer at the undesired locations and can leave on the substrate (e.g., leave on the surface of the first superconductor) the oxidized layer at the desired location.

In some cases, the geometry, topography, and/or topology of the resist profile can make it difficult to cast a shadow only on the desired location and not on the undesired locations by using a single ion milling step. In such cases, multiple ion milling steps can be implemented (e.g., sequentially) and/or chained together from multiple directions/angles after the intermediate oxidation and before the second deposition to ensure that the oxidized layer is removed from the undesired locations and not removed from the desired location. For example, suppose that a primary tunnel junction is desired at a first location but not at a second location and not at a third location. Further, suppose that, given the geometry of the resist profile, there is no ion milling direction that causes the resist profile to cast a shadow only on the first location and not on the second and third locations. Suppose, however, that there is a first ion milling direction that causes the resist profile to cast a shadow over the first location and the second location but not over the third location, and that there is a second ion milling direction that causes the resist profile to cast a shadow over the first location and the third location but not over the second location. In such case, ion milling can be performed twice. Specifically, the first ion milling direction can remove oxidized material from the third location and not from the first and second locations, and then the second ion milling direction can remove oxidized material from the second location and not from the first or third locations. That is, in various aspects, the first location can be protected by a shadow during both ion milling steps, the second location can be protected during the first ion milling step but not during the second ion milling step, and the third location can be protected during the second ion milling step but not during the first ion milling step. In various cases, the result can be that the oxidized material at the first location (e.g., the desired location) remains on the substrate (e.g., remains on the surface of the first superconductor) and the oxidized material at the second and third locations (e.g., the undesired locations) are removed from the substrate (e.g., removed from the surface of the first superconductor). In various aspects, any suitable number of ion milling steps can be chained together, based on the desired locations, the undesired locations, and/or the geometry, topography, and/or topology of the resist profile.

Although the above discussion explains embodiments of the invention that implement in-situ ion milling, in various embodiments, any suitable directional etching technique can be implemented to remove oxidation from undesired locations of the substrate (e.g., from undesired locations on the surface of the first superconductor) and to retain oxidation on desired locations of the substrate (e.g., on desired locations on the surface of the first superconductor).

To help clarify the above discussion, consider the following example. Suppose that a first superconductor is deposited/evaporated through a patterned resist stack onto regions A, B, and C of a substrate. Furthermore, suppose that the surface of the first superconductor is oxidized to create an oxidation layer in regions A, B, and C. Further still, suppose that it is desired to create a primary Josephson junction at region A and to have no junction structures at regions B and C. If the oxidation is immediately followed by a second deposition/evaporation, then a second superconductor can be deposited onto the oxidation layer in regions A, B, and C. Although this creates the primary Josephson junction in region A, it also creates junction structures (e.g., the oxidation layer sandwiched between the first and second superconductors) in regions B and C. In other words, spurious junctions can be formed. In various embodiments of the invention, on the other hand, the oxidation can be followed by an in-situ ion milling step, and the second deposition can occur after the in-situ ion milling step. In various aspects, a direction can be determined based on the geometry, topography, and/or topology of the patterned resist stack and based on the regions A, B, and C, such that ion milling along the determined direction can remove the oxidation layer from regions B and C without removing the oxidation layer from region A. For instance, suppose that ion milling from direction W would cause the patterned resist stack to project a shadow onto regions A and B; suppose that ion milling from direction X would cause the patterned resist stack to project a shadow onto region C; suppose that ion milling from direction Y would cause the patterned resist stack to project a shadow onto regions B and C; and suppose that ion milling from direction Z would cause the patterned resist stack to project a shadow onto region A. In such case, ion milling along direction W would remove the oxidation layer from the region C but not from the regions A and B (e.g., the region C can be unprotected by the shadow and the regions A and B can be protected by the shadow when ion milling occurs in direction W); ion milling along direction X would remove the oxidation layer from the regions A and B but not from the region C (e.g., the regions A and B can be unprotected by the shadow and the region C can be protected by the shadow when ion milling occurs in direction X); ion milling along direction Y would remove the oxidation layer from the region A but not from the regions B and C (e.g., the region A can be unprotected by the shadow and the regions B and C can be protected by the shadow when ion milling occurs in direction Y); and ion milling along direction Z would remove the oxidation layer from the regions B and C but not from the region A (e.g., the regions B and C can be unprotected by the shadow and the region A can be protected by the shadow when ion milling occurs in direction Z). Thus, in various aspects, ion milling can be performed in direction Z after the oxidation, thereby removing the oxidation layer in the regions B and C while leaving the oxidation layer in the region A. Next, the second superconductor can be deposited over the oxidation layer in the region A. Even if the second superconductor is deposited in the regions B and C as well, no spurious junctions can be formed since the oxidation layer in the regions B and C was removed via the ion milling (e.g., since the oxidation layer in the regions B and C was removed, there can be no oxidation layer sandwiched between the first and second superconductors in the regions B and C). In this way, various embodiments of the invention can prevent the formation of spurious junctions during microfabrication and/or nanofabrication of superconducting qubits.

Moreover, in various aspects, embodiments of the invention can reduce the oxidation time needed to create and/or form a tunnel barrier layer on the substrate (e.g., on the surface of the first superconductor). In various aspects, as mentioned above, an ion milling step can be performed after an intermediate oxidation step and before a second deposition step of a shadow evaporation process. In various instances, such an ion milling step can change the characteristics of the tunnel barrier layer (e.g., can change the chemical composition, inductance, and/or aging characteristics of the tunnel barrier layer). Furthermore, in various aspects, such an ion milling step can avoid negatively impacting the subsequent quantum computing performance of the tunnel barrier layer. In various aspects, implementation of the ion milling step can allow for a reduction in the duration of the intermediate oxidation step (e.g., which precedes the ion milling step). For example, suppose that, without an ion milling step as described herein, an intermediate oxidation step takes $T_1$ seconds for any suitable number $T_1$ (e.g., $T_1$ seconds for the intermediate oxidation process to cause a portion of the surface of the first superconductor to form into the tunnel barrier layer with desired properties and/or desired inductance). In various aspects, when an ion milling step as described herein is implemented after the intermediate oxidation step, the intermediate oxidation step can instead require $T_2$ seconds, where $T_2<T_1$. In such case, the intermediate oxidation step can be considered as incomplete; that is, the material characteristics and/or composition of the tunnel barrier layer that results from the shortened intermediate oxidation step can be different than the chemical barrier layer that would result from the un-shortened intermediate oxidation step. However, in such case, the ion milling step that follows the shortened intermediate oxidation step can change the inductance of the tunnel barrier layer so as to match the inductance of the chemical barrier layer that would result from the un-shortened intermediate oxidation step. That is, the inductance of a tunnel barrier layer that results from an intermediate oxidation step of $T_1$ seconds can, in some cases, be equivalent to the inductance of a tunnel barrier layer that results when an intermediate oxidation step of $T_2$ seconds is followed by an ion milling step as described herein. In other words, because the ion milling step as described herein can, in some cases, change the inductance of the tunnel barrier layer in a way similar to increased and/or longer oxidation, an equivalent tunnel barrier layer can be obtained even when less time is expended during the intermediate oxidation step that precedes the ion milling step. Therefore, embodiments of the invention can, in various aspects, not only prevent the formation of spurious junctions, but can also reduce an amount of oxidation time required to form primary junctions.

Various embodiments of the invention include novel systems and/or techniques for facilitating spurious junction prevention via in-situ ion milling that are not abstract, that are not natural phenomena, that are not laws of nature, and that cannot be performed as a set of mental acts by a human. Instead, various embodiments of the invention include systems and/or techniques for facilitating spurious junction prevention without requiring substantially expensive and/or time-consuming fabrication and/or post fabrication steps. Spurious junctions can negatively affect performance of a quantum computing system. Although shorting spurious junctions can mitigate such negative effects, shorting spurious junctions requires additional depositions and can introduce other performance detriments to the quantum computing system (e.g., loss of performance, decreased yield, accelerated junction aging). Various embodiments of the invention can prevent the very formation of spurious junctions during microfabrication and/or nanofabrication of superconducting qubits. Specifically, a shadow evaporation process can include a first deposition, an intermediate oxidation, and a second deposition. In various aspects, a directional etching step (e.g., in-situ ion milling) can be implemented after the intermediate oxidation and before the second deposition. In various cases, the directional etching can be aimed so that a first portion of the oxidation layer that is located in undesired locations can be unprotected by a resist shadow and can thus be removed, and so that a second portion of the oxidation layer that is located in a desired location can protected by the resist shadow and can thus be maintained. In other words, embodiments of the invention provide for novel superconducting qubit fabrication processes that can be implemented to manufacture quantum computing systems without spurious junctions. This can improve the performance and/or functioning of the quantum computing systems. Therefore, various embodiments of the invention constitute concrete and tangible technical improvements in the field of superconducting qubit fabrication.

In various aspects, it should be appreciated that the figures of this disclosure are exemplary and non-limiting only and are not necessarily drawn to scale.

FIG. 1 illustrates a block diagram of example, non-limiting Josephson junction structures 100 in accordance with one or more embodiments described herein. As shown, FIG. 1 depicts the Josephson junction structure 102 and the Josephson junction structure 104. In various aspects, the Josephson junction structure 102 can comprise a spurious junction, and the Josephson junction structure 104 can lack a spurious junction.

In various embodiments, the Josephson junction structure 102 can comprise a first superconducting layer 106. In various aspects, the first superconducting layer 106 can be any suitable superconductor (e.g., aluminum). In various instances, the Josephson junction structure 102 can comprise a tunnel barrier layer 108. In various aspects, the tunnel barrier layer 108 can be on, on top of, and/or over the first superconducting layer 106. In various cases, the tunnel barrier layer 108 can be any suitable tunnel barrier material. In some instances, the tunnel barrier layer 108 can be an oxidized form of the first superconducting layer 106 (e.g., aluminum oxide). In various aspects, the Josephson junction structure 102 can comprise a second superconducting layer 110. In various aspects, the second superconducting layer 110 can be any suitable superconductor (e.g., aluminum). In various aspects, the second superconducting layer 110 can comprise a same superconductor as the first superconducting layer 106. In various aspects, the second superconducting layer 110 can comprise a different superconductor than the first superconducting layer 106. In various embodiments, the second superconducting layer 110 can be on, on top of, and/or over the tunnel barrier layer 108. In various instances, the second superconducting layer 110 can be discontiguous and/or discontinuous. In other words, the second superconducting layer 110 can, in some cases, be divided into two or more portions by a gap 112. As shown in FIG. 1, this can result in a portion 110a of the second superconducting layer 110 that is to the right of the gap 112 and a portion 110b of the second superconducting layer 110 that is to the left of the gap 112. Although illustrated in FIG. 1 as contiguous, the first superconducting layer 106 can also be considered as having two portions, similar to the second superconducting layer 110. In various instances, this can result in a portion 106a of the first superconducting layer 106 that is to the right of the gap 112 and a portion 106b of the first superconducting layer 106 that is to the left of the gap 112. In various aspects, the gap 112 can be created by a resist profile shadow during a multi-angle shadow evaporation process. In various instances, suppose that the area and/or region of the Josephson junction structure 102 that is to the right of the gap 112 is considered a desired location for a tunnel junction and that the area and/or region of the Josephson junction structure 102 that is to the left of the gap 112 is considered an undesired location for a tunnel junction. As shown, the Josephson junction structure 102 can, in various instances, comprise a primary Josephson junction 114 in the desired location and a spurious junction 116 in the undesired location. As mentioned above, a Josephson junction (e.g., a tunnel junction) can be formed when a barrier layer is sandwiched between two superconductors. As shown in FIG. 1, the primary Josephson junction 114 can be formed by the tunnel barrier layer 108 being sandwiched between the portion 106a of the first superconducting layer 106 and the portion 110a of the second superconducting layer 110. As also shown in FIG. 1, the spurious junction 116 can be formed by the tunnel barrier layer 108 being sandwiched between the portion 106b of the first superconducting layer 106 and the portion 110b of the second superconducting layer 110. In various aspects, performance of the Josephson junction structure 102 can be suboptimal due to the presence of the spurious junction 116.

In various embodiments, the Josephson junction structure 104 can comprise the first superconducting layer 106, the tunnel barrier layer 108, and the second superconducting layer 110, as shown. In various aspects, the second superconducting layer 110 can be discontiguous, and thus divided into the portion 110a and the portion 110b. Similarly, the first superconducting layer 106 can also be considered as comprising the portion 106a and the portion 106b. As shown, the Josephson junction structure 104 can comprise the primary Josephson junction 114, just like the Josephson junction structure 102 (e.g., the tunnel barrier layer 108 can be sandwiched between the portion 106a of the first superconducting layer 106 and the portion 110a of the second superconducting layer 110). However, the Josephson junction structure 104 can lack the spurious junction 116. Instead, in various aspects, the Josephson junction structure 104 can comprise an ohmic contact 118. In various aspects, the ohmic contact 118 can represent the plane and/or interface of contact between the portion 106b of the first superconducting layer 106 and the portion 110b of the second superconducting layer 110. In various aspects, the ohmic contact 118 can be a non-superconducting interface (e.g., an interface that is characterized by Ohm's law) between the portion 106b of the first superconducting layer 106 and the portion 110b of the second superconducting layer 110. In various aspects, the performance of the Josephson junction structure 104 can be improved due to the absence of the spurious junction 116 and to the presence of the ohmic contact 118.

In various embodiments, the Josephson junction structure 104 can comprise the first superconducting layer 106, where the first superconducting layer 106 has the portion 106a and the portion 106b. In various aspects, the Josephson junction structure 104 can comprise the tunnel barrier layer 108, where the tunnel barrier layer 108 can be on the portion 106a of the first superconducting layer 106. In various aspects, the Josephson junction structure 104 can comprise the second superconducting layer 110, which can have the portion 110a that is on the tunnel barrier layer 108 and which can have the portion 110b that is on the portion 106b of the first superconducting layer 106. In various embodiments, the portion 106b of the first superconducting layer 106 and the portion 110b of the second superconducting layer 110 can be in ohmic contact 118. In various embodiments, the portion 106a of the first superconducting layer 106, the tunnel barrier layer 108, and the portion 110a of the second superconducting layer 110 can form the primary Josephson junction 114. In various embodiments, the portion 110a of the second superconducting layer 110 and the portion 110b of the second superconducting layer 110 can be discontiguous.

Various embodiments of the invention can be implemented as micro-fabrication and/or nano-fabrication processes to manufacture the Josephson junction structure 104 (e.g., to fabricate superconducting qubits without spurious junctions). As explained above, when a shadow evaporation process is employed to manufacture superconducting qubits, implementing a directional etching step (e.g., in-situ ion milling) between the intermediate oxidation step and the second deposition/evaporation step can, in various instances, prevent the formation of spurious junctions.

Figure 2:
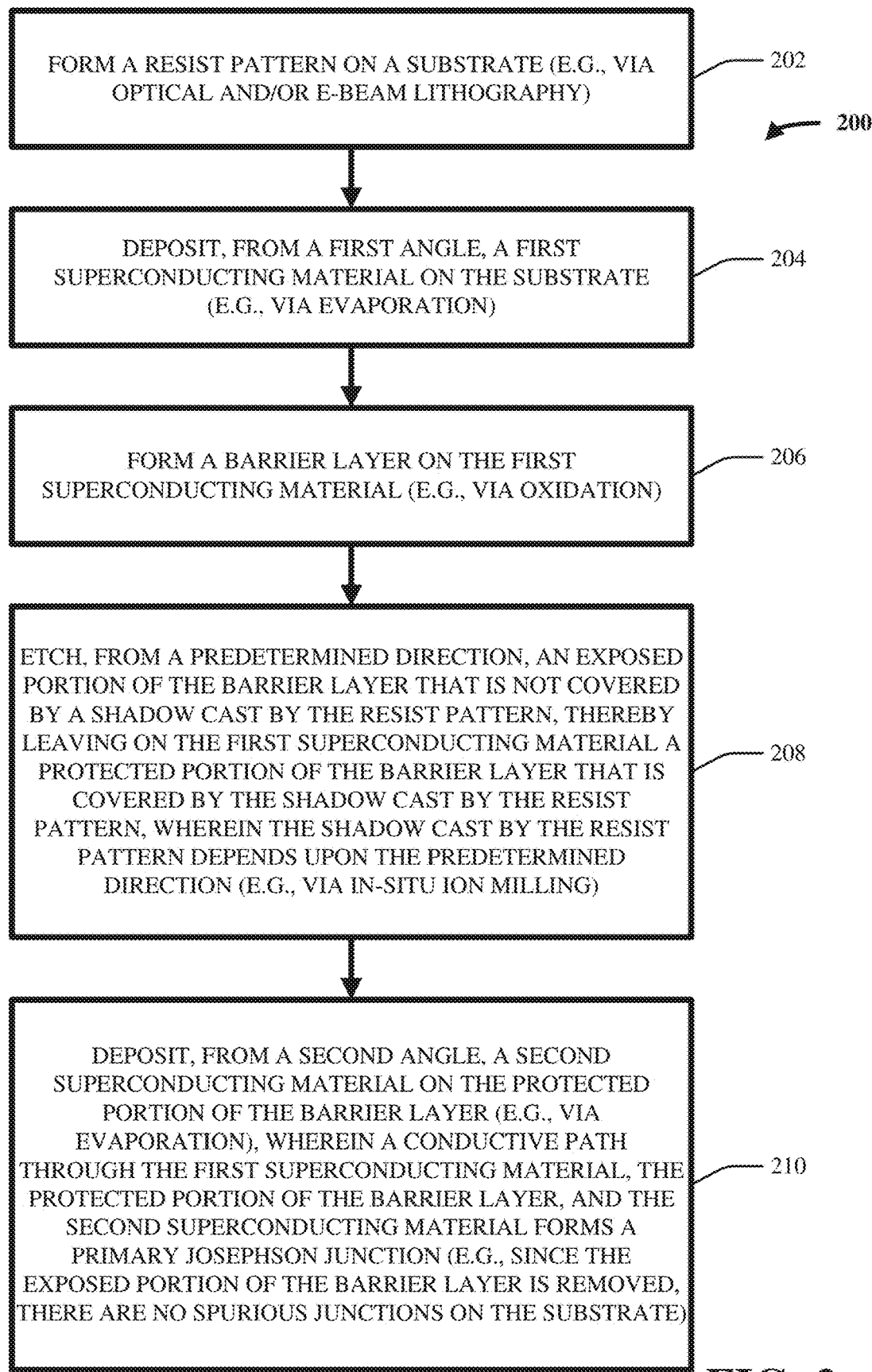
FIG. 2 illustrates a flow diagram of an example, non-limiting method that facilitates spurious junction prevention via in-situ ion milling in accordance with one or more embodiments described herein.

FIG. 2 illustrates a flow diagram of an example, non-limiting method 200 that can facilitate spurious junction prevention via in-situ ion milling in accordance with one or more embodiments described herein. In various aspects, the method 200 can be used to fabricate the Josephson junction structure 104.

In various embodiments, act 202 can include forming a resist pattern on a substrate. In various aspects, one or more resist layers can be spun and/or baked onto the substrate (e.g., a silicon substrate), and any suitable technique can be used to define bridges, alleys, streets, and/or trenches in the one or more resist layers (e.g., electron beam (e-beam) lithography and/or optical lithography).

In various instances, act 204 can include depositing, from a first angle, a first superconducting material on the substrate. In various aspects, this can be facilitated via evaporation. In various aspects, the first superconducting material can be deposited on the substrate in the alleys, streets, and/or trenches defined in the resist pattern.

In various aspects, act 206 can include forming a barrier layer on the first superconducting material. In various cases, this can be facilitated via oxidation.

In various embodiments, act 208 can include etching, from a predetermined direction, an exposed portion of the barrier layer that is not covered by a shadow cast by the resist pattern. In various cases, this can leave on the first superconducting material a protected portion of the barrier layer that is covered by the shadow cast by the resist pattern. In various aspects, this can be facilitated via in-situ ion milling. In various aspects, the shadow cast by the resist pattern can depend upon the predetermined direction. As mentioned above, in various instances, the shadow that is cast and/or projected by the resist pattern can be based on the features (e.g., bridges, alleys, streets, trenches) of the resist pattern and on the direction of the etching and/or ion milling. In various cases, a direction can be determined and/or selected such that etching in that direction can cause the resist pattern to cast and/or project a shadow onto a desired portion of the barrier layer (e.g., a location at which a primary junction is desired) and can cause the resist pattern to not cast and/or project a shadow onto an undesired portion of the barrier layer (e.g., a location at which no junction is desired). In such case, etching in the determined direction can remove from the substrate the undesired portion of the barrier layer (e.g., that part of the barrier layer that is not protected by the shadow of the resist pattern) and can leave on the substrate the desired portion of the barrier layer (e.g., that part of the barrier layer that is protected by the shadow of the resist pattern).

In various instances, act 210 can include depositing, from a second angle, a second superconducting material on the protected portion of the barrier layer. In various aspects, this can be facilitated via evaporation. In various instances, a conductive path through the first superconducting material, the protected portion of the barrier layer, and the second superconducting material can form a primary Josephson junction.

In various cases, the formation of spurious junctions can be prevented due to the removal/etching of the exposed portion of the barrier layer. As mentioned above, a spurious junction can be formed when the second superconducting material is deposited/evaporated onto the barrier layer at an undesired location. Thus, if the barrier layer does not exist at the undesired location, no spurious junction can form there. As explained above, the etching of act 208 can remove from the substrate those parts of the barrier layer that are located in undesired locations (e.g., can removed the exposed portion of the barrier layer). That is, various embodiments of the invention can prevent the formation of spurious junctions during shadow evaporation processes.

FIG. 3 illustrates a block diagram of an example, non-limiting intermediate substrate structure 300 in accordance with one or more embodiments described herein. In various aspects, FIG. 3 can depict the intermediate substrate structure 300 during a shadow evaporation process for the manufacture of a superconducting qubit.

As shown, FIG. 3 depicts the intermediate substrate structure 300 from an aerial view 302 and from a cross-sectional view 304. In various aspects, the cross-sectional view 304 can be taken along the axis 306.

In various embodiments, the intermediate substrate structure 300 can comprise a substrate 308. In various aspects, the substrate 308 can be any suitable substrate for use in quantum computing systems (e.g., a silicon substrate). Although FIG. 3 depicts the substrate 308 as having a rectangular shape, it should be appreciated that this is non-limiting and for illustration only. In various aspects, the substrate 308 can have any suitable shape, size, and/or dimensions.

In various instances, one or more circuit elements 310 can be formed on the substrate 308. In various aspects, the one or more circuit elements 310 can be capacitor pads intended to shunt a Josephson junction. In various aspects, the one or more circuit elements 310 can be any other suitable circuit elements for use in quantum computing systems (e.g., inductors, waveguides, resonators, couplers). In various aspects, the one or more circuit elements 310 can comprise any suitable superconducting material (e.g., niobium). In various instances, the one or more circuit elements 310 can have any suitable shapes, sizes, and/or dimensions. Although FIG. 3 depicts only two circuit elements 310, this is non-limiting and for illustration only. In various aspects, any suitable number of the one or more circuit elements 310 can be implemented. In various aspects, the one or more circuit elements 310 can be arranged on the substrate 308 in any suitable location, arrangement, and/or fashion.

In various instances, the intermediate substrate structure 300 can be any suitable substrate structure on which it is desired to form and/or fabricate a Josephson junction (e.g., tunnel junction). In the example shown in FIG. 3, it can be desired to form a Josephson junction between the one or more circuit elements 310 (e.g., the one or more circuit elements 310 can, in some cases, be capacitor pads that are intended to shunt a Josephson junction).

Figure 4:
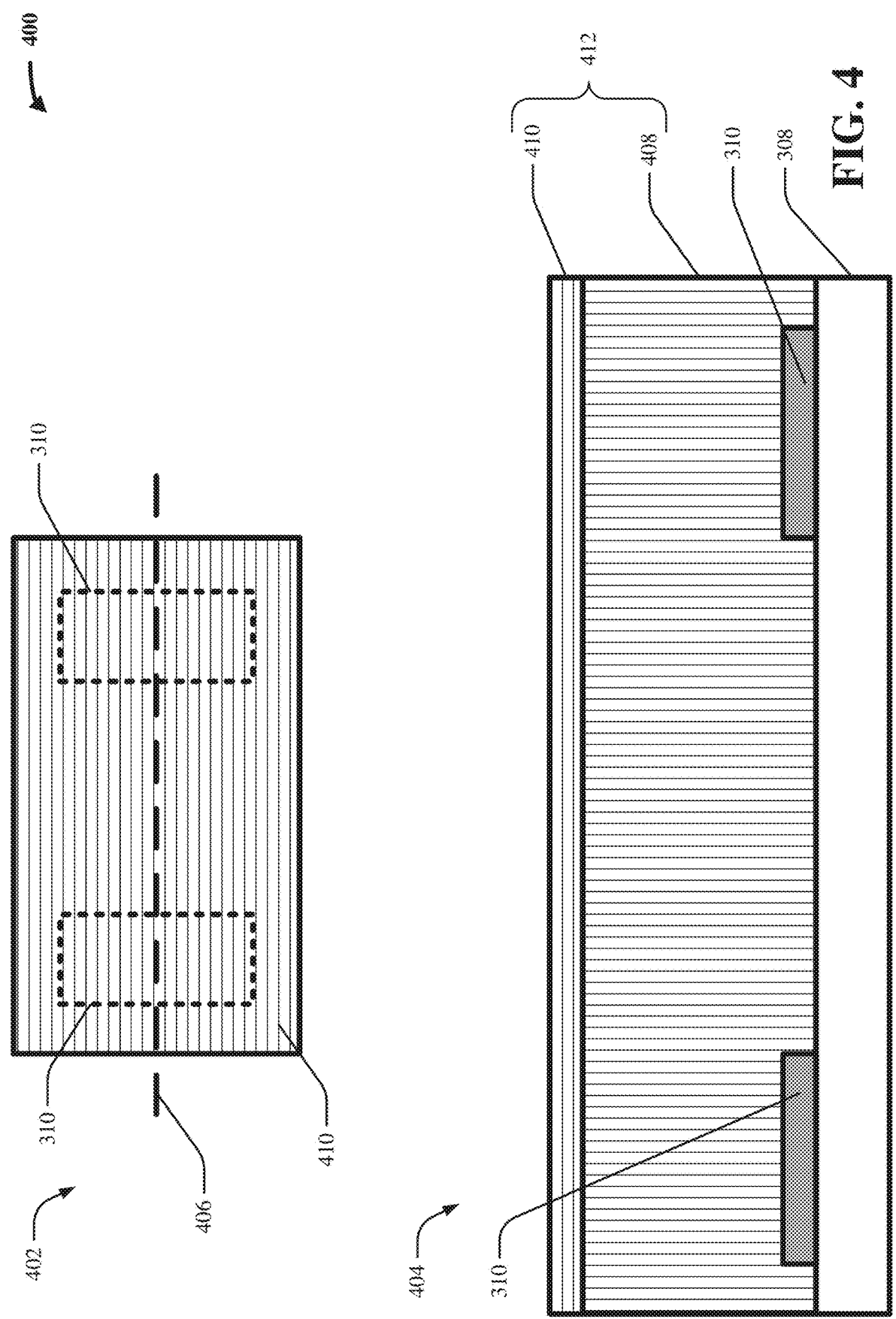
FIG. 4 illustrates a block diagram of an example, non-limiting intermediate substrate structure including a resist stack in accordance with one or more embodiments described herein.

FIG. 4 illustrates a block diagram of an example, non-limiting intermediate substrate structure 400 including a resist stack in accordance with one or more embodiments described herein. In various aspects, FIG. 4 can depict the intermediate substrate structure 400 during a shadow evaporation process for the manufacture of a superconducting qubit. In various instances, the intermediate substrate structure 400 can be considered as the result obtained by forming a bi-layer resist stack on the intermediate substrate structure 300.

As shown, FIG. 4 depicts the intermediate substrate structure 400 from an aerial view 402 and from a cross-sectional view 404. In various aspects, the cross-sectional view 404 can be taken along the axis 406.

In various embodiments, the intermediate substrate structure 400 can comprise the substrate 308 and the one or more circuit elements 310. In various aspects, the intermediate substrate structure 400 can include a first resist layer 408 and a second resist layer 410. In various instances, the first resist layer 408 can be an MMA and/or a PMMA layer that is spun, baked, and/or developed onto the substrate 308. In various instances, the second resist layer 410 can be an MMA and/or a PMMA layer that is spun, baked, and/or developed onto the first resist layer 408. In various aspects, the first resist layer 408 and the second resist layer 410 can together be considered as a bi-layer resist stack 412. In various aspects, the bi-layer resist stack 412 can be leveraged during a shadow evaporation process to fabricate a Josephson junction. In various instances, the second resist layer 410 can be subsequently leveraged to create one or more suspended resist bridges, as discussed below. In various instances, the first resist layer 408 and/or the second resist layer 410 can have any suitable sizes, shapes, and/or dimensions.

Figure 5:
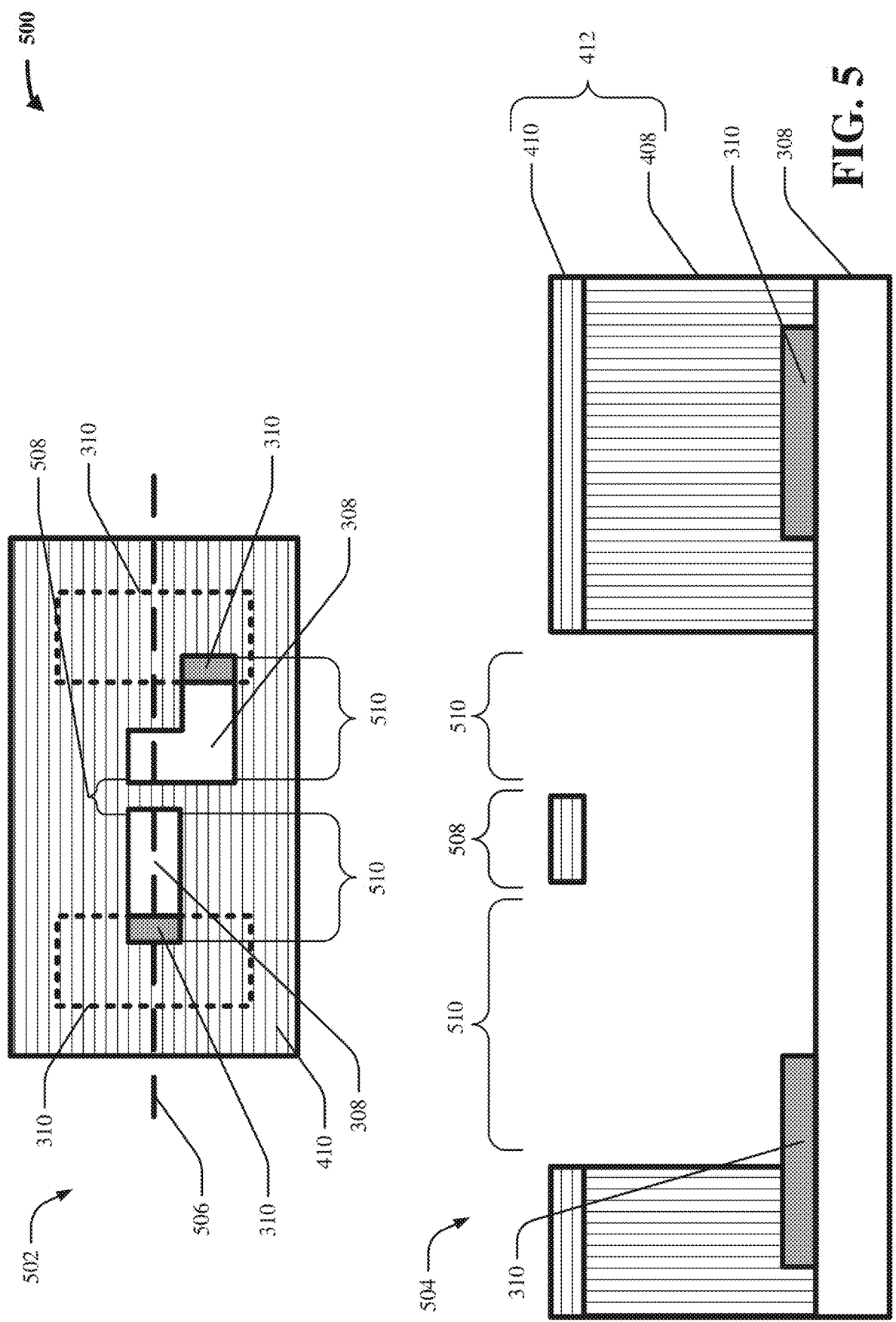
FIG. 5 illustrates a block diagram of an example, non-limiting intermediate substrate structure including a patterned resist stack in accordance with one or more embodiments described herein.

FIG. 5 illustrates a block diagram of an example, non-limiting intermediate substrate structure 500 including a patterned resist stack in accordance with one or more embodiments described herein. In various aspects, FIG. 5 can depict the intermediate substrate structure 500 during a shadow evaporation process for the manufacture of a superconducting qubit. In various instances, the intermediate substrate structure 500 can be considered as the result obtained by patterning the bi-layer resist stack 412 on the intermediate substrate structure 400.

As shown, FIG. 5 depicts the intermediate substrate structure 500 from an aerial view 502 and from a cross-sectional view 504. In various aspects, the cross-sectional view 504 can be taken along the axis 506.

In various embodiments, the intermediate substrate structure 500 can comprise the substrate 308, the one or more circuit elements 310, and the bi-layer resist stack 412 (e.g., the first resist layer 408 and the second resist layer 410). In various instances, the intermediate substrate structure 500 can include a suspended resist bridge 508 and/or one or more trenches 510. In various aspects, the suspended resist bridge 508 can be formed from the second resist layer 410. In various aspects, the one or more trenches 510 can be any suitable trenches, alleys, and/or streets that are patterned into the first resist layer 408 and/or into the second resist layer 410. In various cases, the suspended resist bridge 508 and/or the one or more trenches 510 can be leveraged during subsequent depositions steps to create a primary Josephson junction on the substrate 308.

In various aspects, the suspended resist bridge 508 and/or the one or more trenches 510 can be formed via any suitable lithography technique (e.g., electron beam lithography and/or optical lithography). In various instances, the suspended resist bridge 508 can have any suitable shape, size, dimensions, and/or location. In various aspects, the one or more trenches 510 can have any suitable shapes, sizes, dimensions, and/or locations. In various aspects, the shapes, sizes, dimensions, and/or locations of the suspended resist bridge 508 and/or of the one or more trenches 510 can be based on a desired shape, size, dimensions, and/or location of a primary Josephson junction to be formed on the substrate 308. In other words, the shapes, sizes, dimensions, and/or locations of the suspended resist bridge 508 and/or of the one or more trenches 510 can be designed (e.g., via electron beam lithography and/or optical lithography) so that they can be leveraged during subsequent depositions/evaporations to create a primary Josephson junction of desired size and/or desired shape in a desired location on the substrate 308.

As shown, in various aspects, the one or more trenches 510 can extend and/or partially extend over a portion of the one or more circuit elements 310 (e.g., the left trench 510 can extend over a portion of the left circuit element 310, the right trench 510 can extend over a portion of the right circuit element 310). In various aspects, this can enable the primary Josephson junction that is to be formed on the substrate 308 to contact the one or more circuit elements 310.

Figure 6:
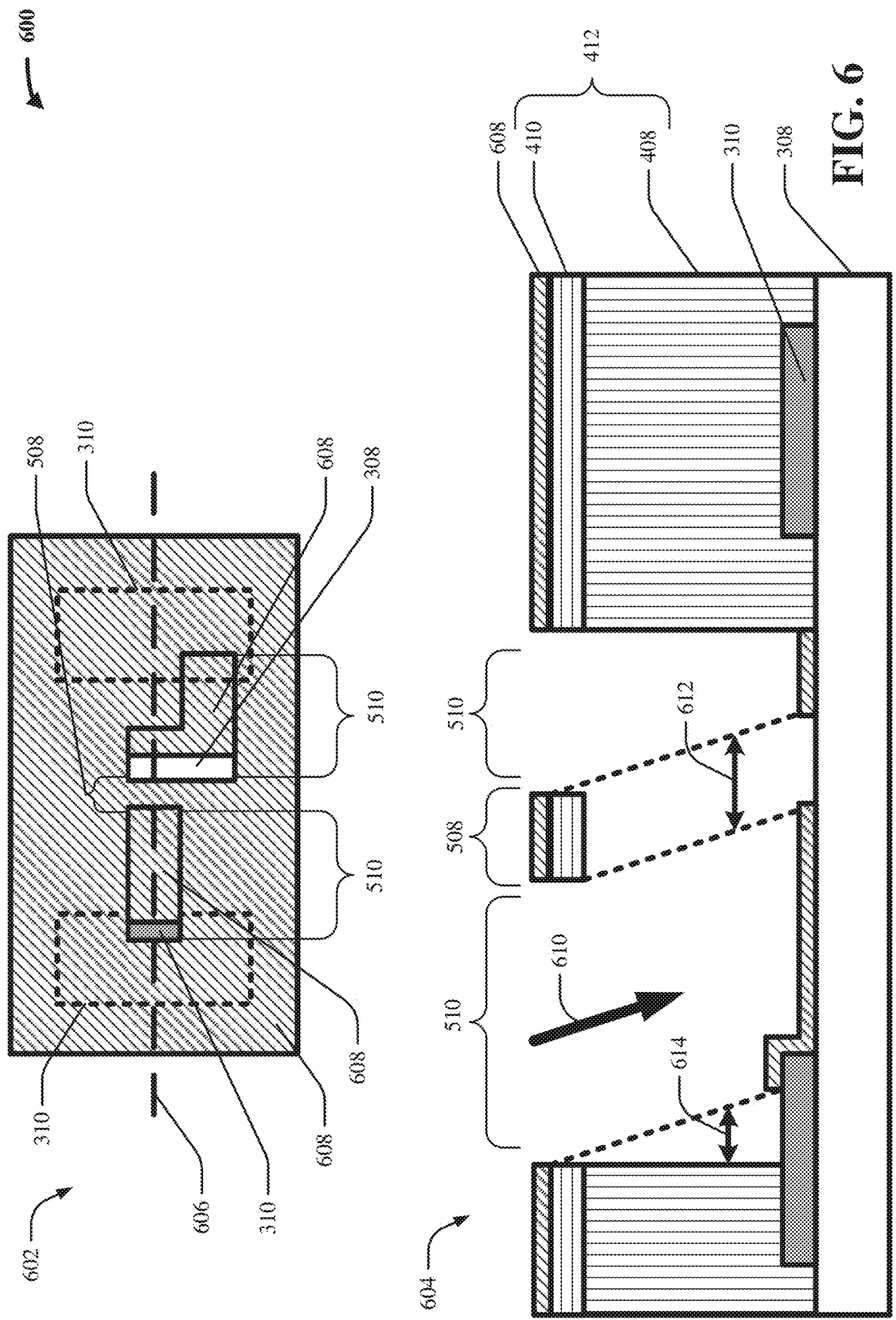
FIG. 6 illustrates a block diagram of an example, non-limiting intermediate substrate structure including a first superconducting material in accordance with one or more embodiments described herein.

FIG. 6 illustrates a block diagram of an example, non-limiting intermediate substrate structure 600 including a first superconducting material in accordance with one or more embodiments described herein. In various aspects, FIG. 6 can depict the intermediate substrate structure 600 during a shadow evaporation process for the manufacture of a superconducting qubit. In various instances, the intermediate substrate structure 600 can be considered as the result obtained by depositing/evaporating a first superconducting layer onto the intermediate substrate structure 500.

As shown, FIG. 6 depicts the intermediate substrate structure 600 from an aerial view 602 and from a cross-sectional view 604. In various aspects, the cross-sectional view 604 can be taken along the axis 606.

In various embodiments, the intermediate substrate structure 600 can comprise the substrate 308, the one or more circuit elements 310, the bi-layer resist stack 412 (e.g., the first resist layer 408 and the second resist layer 410), the suspended resist bridge 508, and the one or more trenches 510.

In various embodiments, the intermediate substrate structure 600 can comprise a first superconducting layer 608. In various aspects, the first superconducting layer 608 can be any suitable superconducting material (e.g., aluminum). In various instances, the first superconducting layer 608 can be formed on, on top of, and/or over the substrate 308. In various instances, the first superconducting layer 608 can have any suitable size, shape, and/or dimensions. In various aspects, the first superconducting layer 608 can be deposited and/or evaporated onto the substrate 308 through the one or more trenches 510 of the bi-layer resist stack 412. In various instances, the first superconducting layer 608 can be deposited and/or evaporated along a direction/angle 610. In various aspects, the direction/angle 610 can be any suitable direction/angle for depositing and/or evaporating the first superconducting layer 608. In various cases, the direction/angle 610 can be based on the geometry of the bi-layer resist stack 412 (e.g., based on the sizes, shapes, dimensions, and/or locations of the suspended resist bridge 508 and/or the one or more trenches 510). In various instances, the suspended resist bridge 508 can cast and/or project a shadow 612 along the direction/angle 610. As shown, the shadow 612 can prevent the first superconducting layer 608 from forming on the substrate 308 at a location that is covered by the shadow 612. Similarly, in various aspects, a wall of the first resist layer 408 and/or of the second resist layer 410 can cast and/or project a shadow 614 along the direction/angle 610. As shown, the shadow 614 can prevent the first superconducting layer 608 from forming on the substrate 308 at a location that is covered by the shadow 614.

Figure 7:
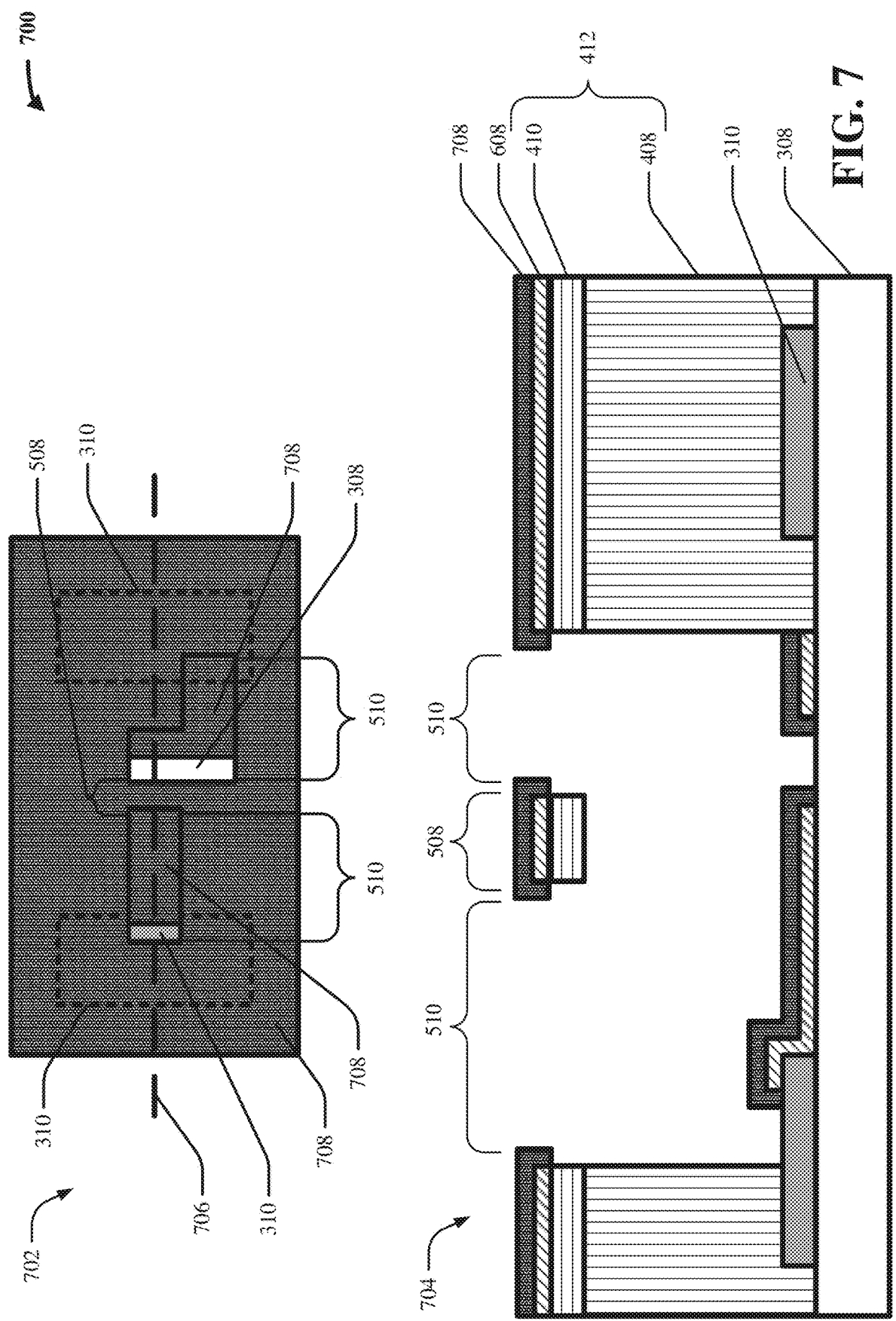
FIG. 7 illustrates a block diagram of an example, non-limiting intermediate substrate structure including a tunnel barrier in accordance with one or more embodiments described herein.

FIG. 7 illustrates a block diagram of an example, non-limiting intermediate substrate structure 700 including a tunnel barrier in accordance with one or more embodiments described herein. In various aspects, FIG. 7 can depict the intermediate substrate structure 700 during a shadow evaporation process for the manufacture of a superconducting qubit. In various instances, the intermediate substrate structure 700 can be considered as the result obtained by oxidizing a surface of the first superconducting layer 608 on the intermediate substrate structure 600.

As shown, FIG. 7 depicts the intermediate substrate structure 700 from an aerial view 702 and from a cross-sectional view 704. In various aspects, the cross-sectional view 704 can be taken along the axis 706.

In various embodiments, the intermediate substrate structure 700 can comprise the substrate 308, the one or more circuit elements 310, the bi-layer resist stack 412 (e.g., the first resist layer 408 and the second resist layer 410), the suspended resist bridge 508, and the one or more trenches 510.

In various embodiments, the intermediate substrate structure 700 can comprise a tunnel barrier layer 708. In various aspects, the tunnel barrier layer 708 can comprise any suitable tunnel barrier material (e.g., an oxide). In various aspects, the tunnel barrier layer 708 can be an oxidized form of the first superconducting layer 608 (e.g., aluminum oxide). In various instances, the tunnel barrier layer 708 can have any suitable size, shape, and/or dimensions. In various cases, the tunnel barrier layer 708 can form the tunnel barrier in the primary Josephson junction that is to be formed on the substrate 308.

Figure 8:
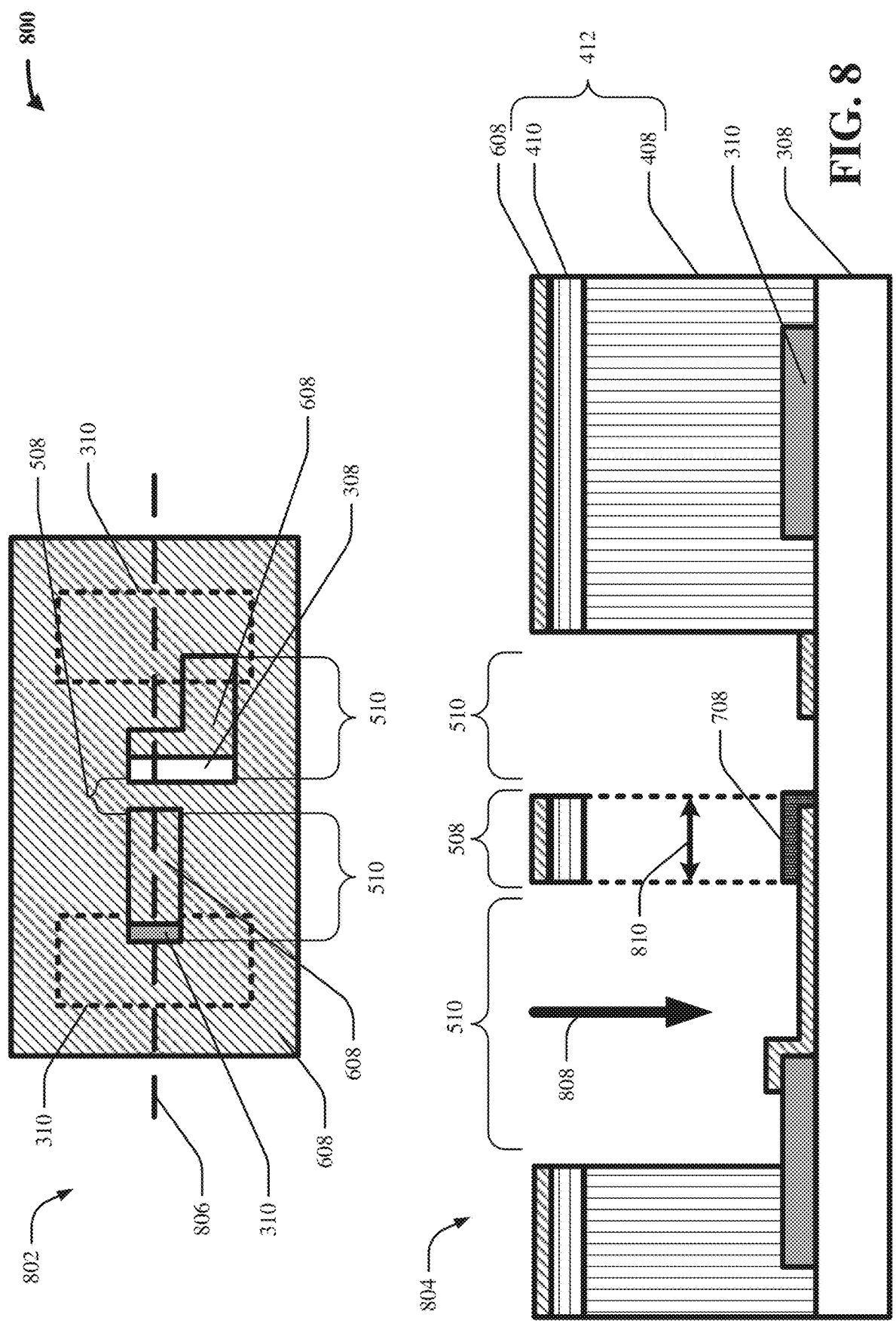
FIG. 8 illustrates a block diagram of an example, non-limiting intermediate substrate structure including a protected portion of a tunnel barrier in accordance with one or more embodiments described herein.

FIG. 8 illustrates a block diagram of an example, non-limiting intermediate substrate structure 800 including a protected portion of a tunnel barrier in accordance with one or more embodiments described herein. In various aspects, FIG. 8 can depict the intermediate substrate structure 800 during a shadow evaporation process for the manufacture of a superconducting qubit. In various instances, the intermediate substrate structure 800 can be considered as the result obtained by ion milling the intermediate substrate structure 700.

As shown, FIG. 8 depicts the intermediate substrate structure 800 from an aerial view 802 and from a cross-sectional view 804. In various aspects, the cross-sectional view 804 can be taken along the axis 806.

In various embodiments, the intermediate substrate structure 800 can comprise the substrate 308, the one or more circuit elements 310, the bi-layer resist stack 412 (e.g., the first resist layer 408 and the second resist layer 410), the suspended resist bridge 508, the one or more trenches 510, and the tunnel barrier layer 708.

In various embodiments, as shown, an in-situ ion milling can be performed along a direction/angle 808. In various instances, the in-situ ion milling can remove and/or etch away any portion of the tunnel barrier layer 708 that is not protected and/or covered by a shadow of the bi-layer resist stack. In various aspects, this uncovered and/or unprotected portion of the tunnel barrier layer 708 can be referred to as an exposed portion of the tunnel barrier layer 708. In various aspects, the exposed portion of the tunnel barrier layer 708 can be any part of the tunnel barrier layer 708 that is depicted in FIG. 7 and not depicted in FIG. 8. In various embodiments, the suspended resist bridge 508 can cast and/or project a shadow 810 along the direction/angle 808. As shown, the shadow 810 can protect from the ion milling the portion of the tunnel barrier layer 708 that is covered by and/or within the shadow 810. In various aspects, this covered and/or protected portion of the tunnel barrier layer 708 can be referred to as a protected portion of the tunnel barrier layer 708.

In various embodiments, the direction/angle 808 can be any suitable direction and/or angle. In various aspects, the direction/angle 808 can be based on the geometry of the bi-layer resist stack 412 (e.g., based on the shapes, sizes, dimensions, and/or locations of the suspended resist bridge 508 and/or of the one or more trenches 510) and/or can be based on the location on the substrate 308 at which a primary Josephson junction is desired. In various aspects, the direction/angle 808 can be controlled, set, and/or chosen so that the shadow 810 is cast and/or projected onto the location at which a primary Josephson junction is desired. When the shadow 810 is cast and/or projected onto the location at which a primary Josephson junction is desired, the portion of the tunnel barrier layer 708 that is at that location can be preserved and/or maintained during the ion milling, and other portions of the tunnel barrier layer 708 that are not at that location can be removed and/or etched during the ion milling.

In various cases, such ion milling can prevent the subsequent formation of spurious junctions. In various aspects, a spurious can form when the tunnel barrier layer 708 is at a location at which a Josephson junction is not desired. Since the ion milling can remove the portions of the tunnel barrier layer 708 that are at locations at which a Josephson junction is not desired, spurious junctions can be no longer able to be unintentionally formed at those locations.

Figure 9:
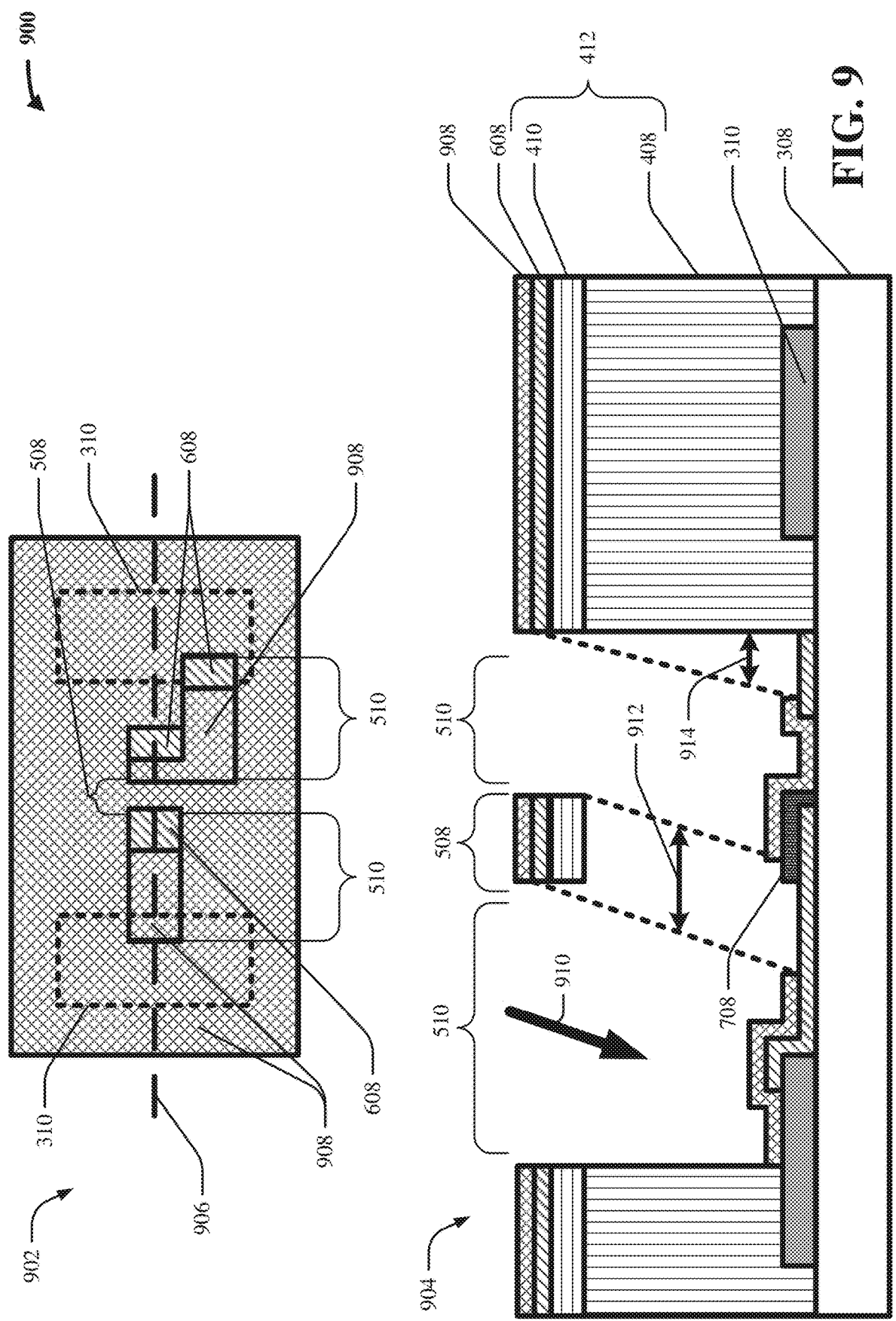
FIG. 9 illustrates a block diagram of an example, non-limiting intermediate substrate structure including a second superconducting material in accordance with one or more embodiments described herein.

FIG. 9 illustrates a block diagram of an example, non-limiting intermediate substrate structure 900 including a second superconducting material in accordance with one or more embodiments described herein. In various aspects, FIG. 9 can depict the intermediate substrate structure 900 during a shadow evaporation process for the manufacture of a superconducting qubit. In various instances, the intermediate substrate structure 900 can be considered as the result obtained by depositing/evaporating a second superconducting layer onto the intermediate substrate structure 800.

As shown, FIG. 9 depicts the intermediate substrate structure 900 from an aerial view 902 and from a cross-sectional view 904. In various aspects, the cross-sectional view 904 can be taken along the axis 906.

In various embodiments, the intermediate substrate structure 900 can comprise the substrate 308, the one or more circuit elements 310, the bi-layer resist stack 412 (e.g., the first resist layer 408 and the second resist layer 410), the suspended resist bridge 508, the one or more trenches 510, the first superconducting layer 608, and the protected portion of the tunnel barrier layer 708.

In various embodiments, the intermediate substrate structure 900 can comprise a second superconducting layer 908. In various aspects, the second superconducting layer 908 can be any suitable superconducting material (e.g., aluminum). In various aspects, the second superconducting layer 908 can be a same superconducting material as the first superconducting layer 608. In various aspects, the second superconducting layer 908 can be a different superconducting material than the first superconducting layer 608. In various instances, the second superconducting layer 908 can be formed on, on top of, and/or over the protected portion of the tunnel barrier layer 708 and/or otherwise on, on top of, and/or over the first superconducting layer 608. In various instances, the second superconducting layer 908 can have any suitable size, shape, and/or dimensions. In various aspects, the second superconducting layer 908 can be deposited and/or evaporated through the one or more trenches 510 of the bi-layer resist stack 412. In various instances, the second superconducting layer 908 can be deposited and/or evaporated along a direction/angle 910. In various aspects, the direction/angle 910 can be any suitable direction/angle for depositing and/or evaporating the second superconducting layer 908. In various cases, the direction/angle 910 can be based on the geometry of the bi-layer resist stack 412 (e.g., based on the sizes, shapes, dimensions, and/or locations of the suspended resist bridge 508 and/or the one or more trenches 510). In various instances, the suspended resist bridge 508 can cast and/or project a shadow 912 along the direction/angle 910. As shown, the shadow 912 can prevent the second superconducting layer 908 from forming at a location that is covered by the shadow 912. Similarly, in various aspects, a wall of the first resist layer 408 and/or of the second resist layer 410 can cast and/or project a shadow 914 along the direction/angle 910. As shown, the shadow 914 can prevent the second superconducting layer 908 from forming at a location that is covered by the shadow 914.

Figure 10:
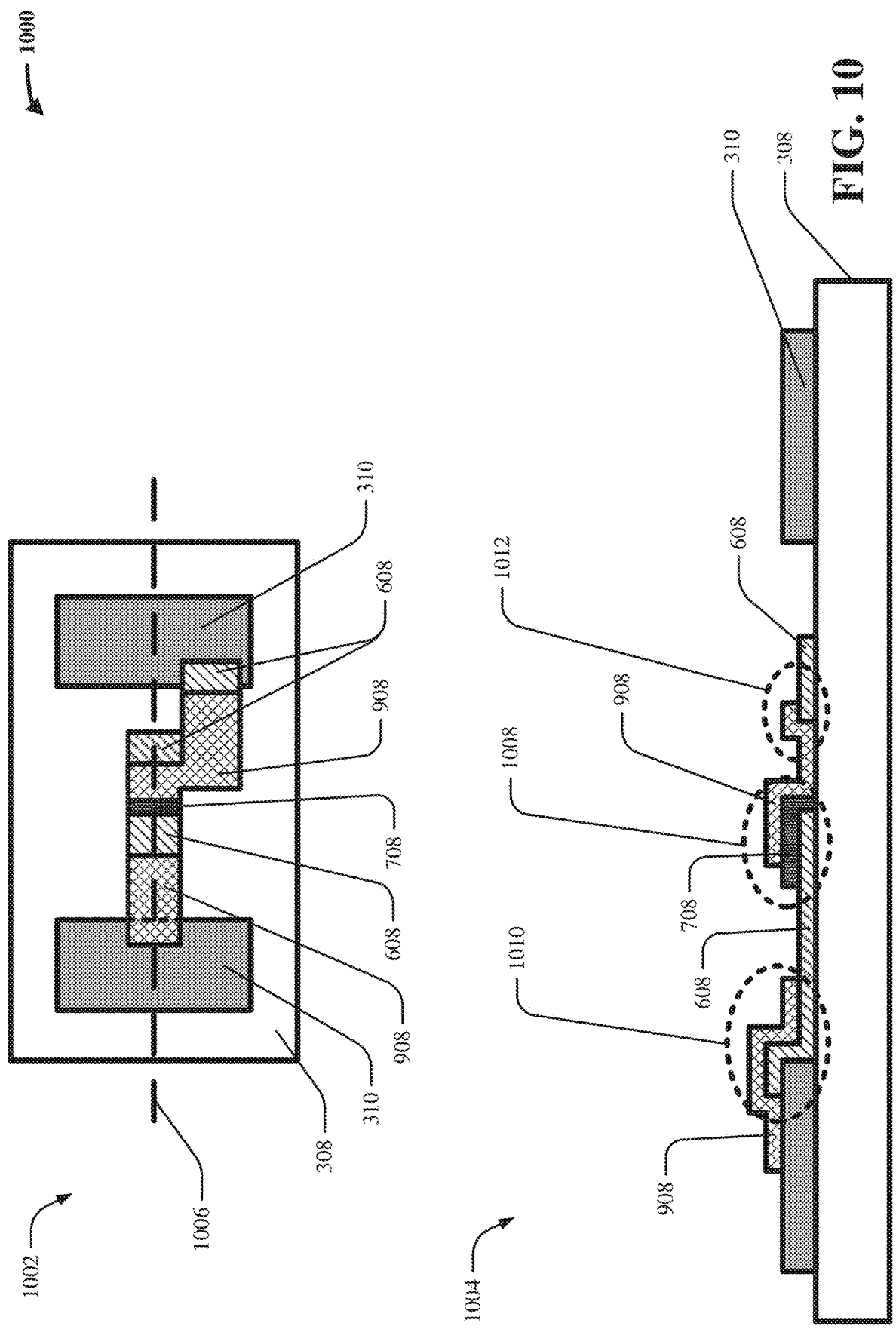
FIG. 10 illustrates a block diagram of an example, non-limiting substrate structure lacking spurious junctions in accordance with one or more embodiments described herein.

FIG. 10 illustrates a block diagram of an example, non-limiting substrate structure 1000 lacking spurious junctions in accordance with one or more embodiments described herein. In various aspects, FIG. 10 can depict the substrate structure 1000 during a shadow evaporation process for the manufacture of a superconducting qubit. In various instances, the substrate structure 1000 can be considered as the result obtained by lifting off the bi-layer resist stack 412 from the intermediate substrate structure 900.

As shown, FIG. 10 depicts the substrate structure 1000 from an aerial view 1002 and from a cross-sectional view 1004. In various aspects, the cross-sectional view 1004 can be taken along the axis 1006.

In various embodiments, the substrate structure 1000 can comprise the substrate 308, the one or more circuit elements 310, the first superconducting layer 608, the protected portion of the tunnel barrier layer 708, and the second superconducting layer 908. In various aspects, the bi-layer resist stack 412 can be removed via any suitable technique (e.g., lift off).

As shown, in various aspects, the substrate structure 1000 can comprise a primary Josephson junction 1008, an ohmic contact 1010, and an ohmic contact 1012. In various aspects, the primary Josephson junction 1008 can comprise the protected portion of the tunnel barrier layer 708 being sandwiched between the first superconducting layer 608 and the second superconducting layer 908. In various aspects, both the ohmic contact 1010 and the ohmic contact 1012 can be regions where the first superconducting layer 608 directly contacts the second superconducting layer 908.

In various embodiments, as shown, the substrate structure 1000 can lack spurious junctions and can instead have the ohmic contact 1010 and the ohmic contact 1012. In various instances, this can be due to the ion milling described with respect to FIG. 8. In various cases, if the ion milling of FIG. 8 were not performed, then the exposed portion of the tunnel barrier layer 708 would not be removed. If the exposed portion of the tunnel barrier layer 708 were not removed, it would be sandwiched between the first superconducting layer 608 and the second superconducting layer 908 at the locations of the ohmic contact 1010 and the ohmic contact 1012. In other words, without the ion milling of FIG. 8, there would be at spurious junction in place of the ohmic contact 1010 and there would be another spurious junction in place of the ohmic contact 1012. Thus, in various embodiments, applying the ion milling step after the oxidation of FIG. 7 and before the second deposition/evaporation step of FIG. 9 can prevent the formation of spurious junctions on the substrate 308.

In various aspects, FIGS. 3-10 depict an exemplary, non-limiting shadow evaporation process that includes an ion milling step after the intermediate oxidation and before the second deposition/evaporation. As mentioned above, the direction and/or angle of the ion milling can be controlled, set, and/or aimed based on the geometry of the bi-layer resist stack. Since the geometry of the bi-layer resist stack can, in some cases, depend upon the type of shadow evaporation process being implemented, the direction and/or angle of the ion milling can be based on the type of shadow evaporation process that is implemented.

In various aspects, FIGS. 3-10 depict an exemplary shadow evaporation process that resembles a Dolan double angle evaporation technique. In various cases, a Dolan double angle evaporation technique utilizes a bridge (e.g., the suspended resist bridge 508) and opposing, parallel evaporation angles, where the primary Josephson junction is desired to be formed beneath the bridge. When a Dolan double angle evaporation technique is used, the ion milling can be performed in a top-down direction. After all, in a Dolan double angle evaporation technique, the desired location of the primary Josephson junction is beneath the bridge, and a top-down ion milling direction can ensure that the bridge casts and/or projects a shadow downward to protect the portion of the tunnel barrier layer that is beneath the bridge.

In various embodiments, the ion milling step can be implemented in any other suitable shadow evaporation process, and the direction and/or angle of the ion milling can be determined, controlled, and/or set accordingly. For example, in some cases, a Manhattan double angle evaporation technique can be used. In such case, the bi-layer resist stack can be bridgeless, can have two orthogonal trenches, and can have two orthogonal evaporation angles. When a Manhattan double angle evaporation technique is used, the ion milling can be performed at a glancing angle that is oriented at 45 degrees between the two orthogonal trenches. After all, in a Manhattan double angle evaporation technique, the desired location of the primary Josephson junction is at the intersection of the two orthogonal trenches, and ion milling at a glancing angle that is 45 degrees between the two orthogonal trenches can ensure that the trench walls cast and/or project a shadow onto the intersection of the two trenches to protect the portion of the tunnel barrier layer that is at the intersection.

In various other embodiments, any other suitable shadow evaporation process can be implemented. For example, in some instances, quadrupole qubit techniques can be implemented. In some cases, a quadrupole qubit technique can be a modified Dolan double angle evaporation technique. In some cases, a modified Dolan double angle evaporation technique can involve two bridges, two orthogonal trenches, and two parallel, opposing evaporation angles. In such case, the first evaporation/deposition can be performed at two glancing angles to cover the shadowed regions, causing the first superconducting layer to be deposited under the two bridges. After oxidation, in various aspects, ion milling can be performed at a glancing angle that is oriented at 45 degrees between the two orthogonal trenches. Finally, a second evaporation can be performed in a top-down direction.

In some other cases, a quadrupole qubit technique can be a modified Manhattan double angle evaporation technique. In some cases, a modified Manhattan double angle evaporation technique can involve a trampoline bridge, two orthogonal trenches, and two orthogonal evaporation angles. In various aspects, the first evaporation/deposition can be performed at two glancing angles to cover the shadowed regions, causing the first superconducting layer to be deposited under the bridge. After oxidation, in various instances, ion milling can be performed in a top-down direction. Finally, a second evaporation can be performed from two glancing angles and orthogonally to the first evaporation.

In various aspects, a shadow evaporation process can include two evaporations/depositions and an intermediate oxidation. In various cases, any shadow evaporation process has the potential to form a spurious junction on a substrate. Various embodiments of the invention can include adding a directional etching step (e.g., in-situ ion milling) after the intermediate oxidation step and before the second evaporation/deposition step. In various cases, such a directional etching step can prevent the subsequent formation of spurious junctions on the substrate. As mentioned above, the directional etching (e.g., ion milling) can be aimed so that a resist profile shadow covers the location at which a primary junction is desired and does not cover locations at which a primary junction is not desired. Thus, in various aspects, a direction/angle of the directional etching can be a function of the geometry of the resist profile and of the locations on the substrate at which Josephson junctions are desired. In various aspects, those having ordinary skill in the art will appreciate how to determine a suitable direction/angle of the directional etching based on the geometry of the resist profile and/or based on the locations at which Josephson junctions are desired and/or not desired (e.g., those having ordinary skill in the art will understand how to choose and/or select an etching angle/direction which will cause the resist profile to cast a shadow onto the desired locations and to not cast a shadow onto the undesired locations).

As mentioned above, in various aspects, embodiments of the invention can reduce an oxidation time that is required during superconducting qubit fabrication. Specifically, when ion milling is implemented after oxidation and before the second deposition, the ion milling can change one or more characteristics of the oxidation layer (e.g., can change the chemical composition, inductance, and/or aging properties of the oxidation layer). In various aspects, a high resistance junction can be obtained by spending a particular amount of time on the intermediate oxidation step. However, in various embodiments, an equivalent high resistance junction can be obtained by spending less time on the intermediate oxidation step if the intermediate oxidation step is followed by ion milling. In such cases, a duration and/or temporal length of the oxidation step can be based on a duration and/or temporal length of the ion milling step. In other words, as more ion milling is performed as described herein, less time can be required to be spent on the intermediate oxidation step, since the subsequent ion milling step can change the inductance of the oxidation layer such that it is equivalent to a barrier inductance obtained from an un-shortened intermediate oxidation step. Thus, not only do various embodiments of the invention prevent the formation of spurious junctions, but they can also reduce an amount of oxidation time required to fabricate high-resistance junctions. Therefore, various embodiments of the invention constitute a concrete and tangible technical improvement in the field of superconducting qubit fabrication.

Figure 11:
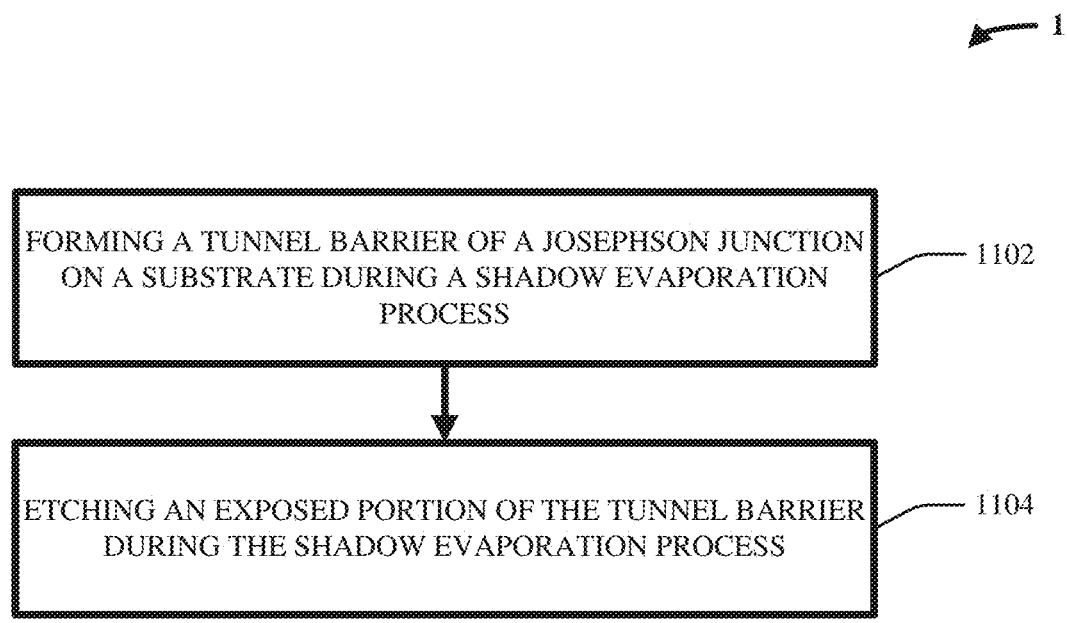
FIG. 11 illustrates a flow diagram of an example, non-limiting method that facilitates spurious junction prevention via in-situ ion milling in accordance with one or more embodiments described herein.

FIG. 11 illustrates a flow diagram of an example, non-limiting method 1100 that can facilitate spurious junction prevention via in-situ ion milling in accordance with one or more embodiments described herein.

In various aspects, act 1102 can include forming a tunnel barrier (e.g., 708) of a Josephson junction (e.g., 1008) on a substrate (e.g., 308) during a shadow evaporation process.

In various instances, act 1104 can include etching an exposed portion of the tunnel barrier during the shadow evaporation process (e.g., as shown with respect to FIG. 8).

In various aspects, the shadow evaporation process can include patterning a resist stack (e.g., 412) onto the substrate. In various cases, the etching the exposed portion of the tunnel barrier can leave a protected portion of the tunnel barrier within a shadow (e.g., 810) of the resist stack.

In various instances, the shadow of the resist stack can be based on a direction (e.g., 808) of the etching the exposed portion of the tunnel barrier.

In various aspects, the resist stack can include a suspended resist bridge (e.g., 508). In some cases, the protected portion of the tunnel barrier can be beneath the suspended resist bridge.

In various instances, the shadow evaporation process can include depositing a first superconducting material (e.g., 608) on the substrate after the patterning the resist stack, oxidizing a surface of the first superconducting material to form the tunnel barrier, and depositing a second superconducting material (e.g., 908) over the protected portion of the tunnel barrier to form the Josephson junction (e.g., 1008). In some cases, the etching the exposed portion of the tunnel barrier can occur after the oxidizing the surface of the first superconducting material and before the depositing the second superconducting material.

Figure 12:
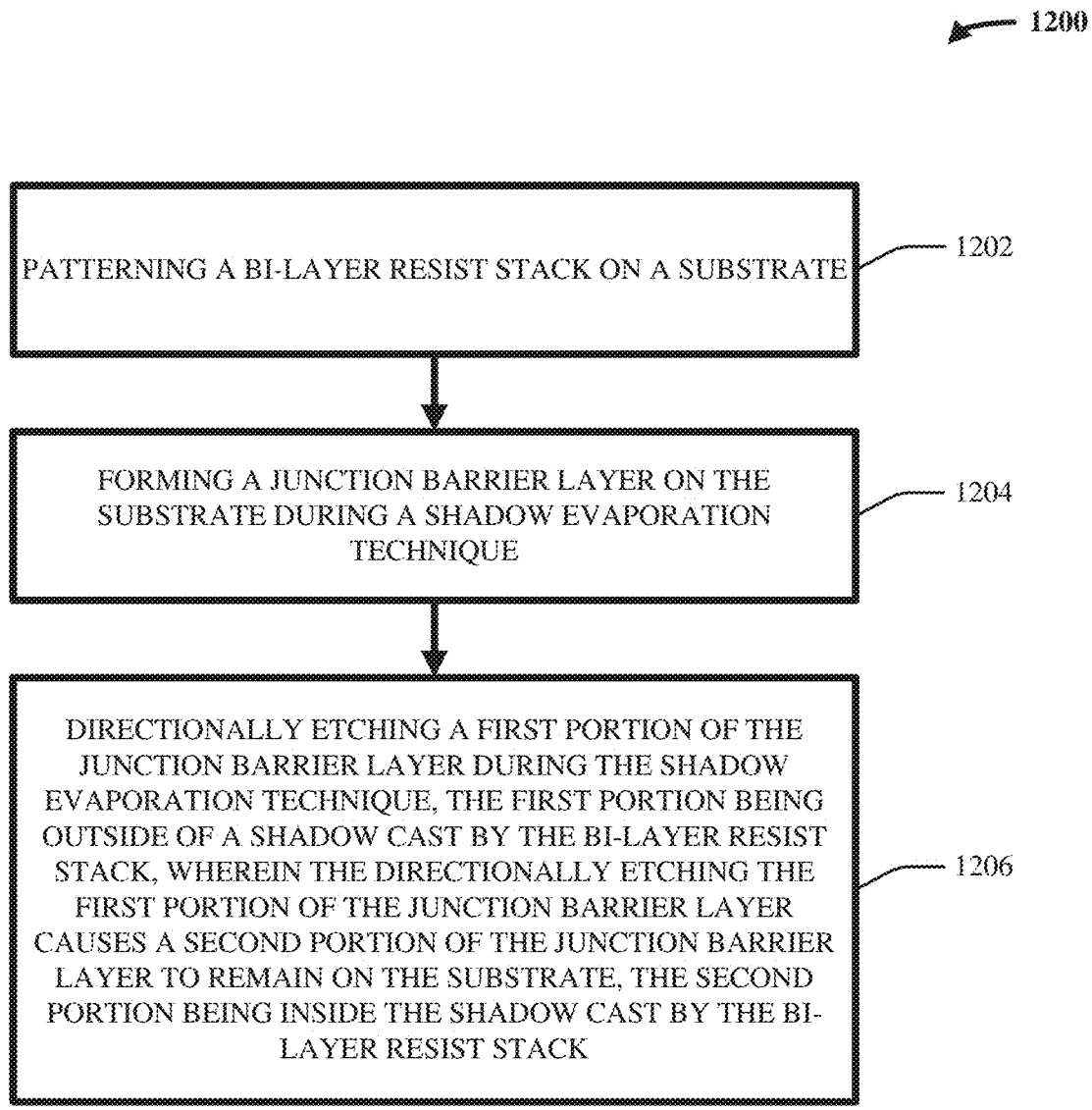
FIG. 12 illustrates a flow diagram of an example, non-limiting method that facilitates spurious junction prevention via in-situ ion milling in accordance with one or more embodiments described herein.

FIG. 12 illustrates a flow diagram of an example, non-limiting method 1200 that can facilitate spurious junction prevention via in-situ ion milling in accordance with one or more embodiments described herein.

In various embodiments, act 1202 can include patterning a bi-layer resist stack (e.g., 412) on a substrate (e.g., 308).

In various instances, act 1204 can include forming a junction barrier layer (e.g., 708) on the substrate during a shadow evaporation technique.

In various aspects, act 1206 can include directionally etching a first portion of the junction barrier layer during the shadow evaporation technique, the first portion being outside of a shadow (e.g., 810) cast by the bi-layer resist stack. In various cases, the directionally etching the first portion of the junction barrier layer can cause a second portion of the junction barrier layer to remain on the substrate, the second portion being inside the shadow cast by the bi-layer resist stack.

In various embodiments, the bi-layer resist stack can include a bridge, and the second portion of the junction barrier layer can lie beneath the bridge.

In various aspects, the shadow evaporation technique can comprise evaporating a first superconductor (e.g., 608) onto the substrate, oxidizing a surface of the first superconductor to form the junction barrier layer, and evaporating a second superconductor (e.g., 908) over the second portion of the junction barrier layer. In various aspects, the directionally etching the first portion of the junction barrier layer can occur after the oxidizing the surface of the first superconductor and before the evaporating the second superconductor.

Figure 13:
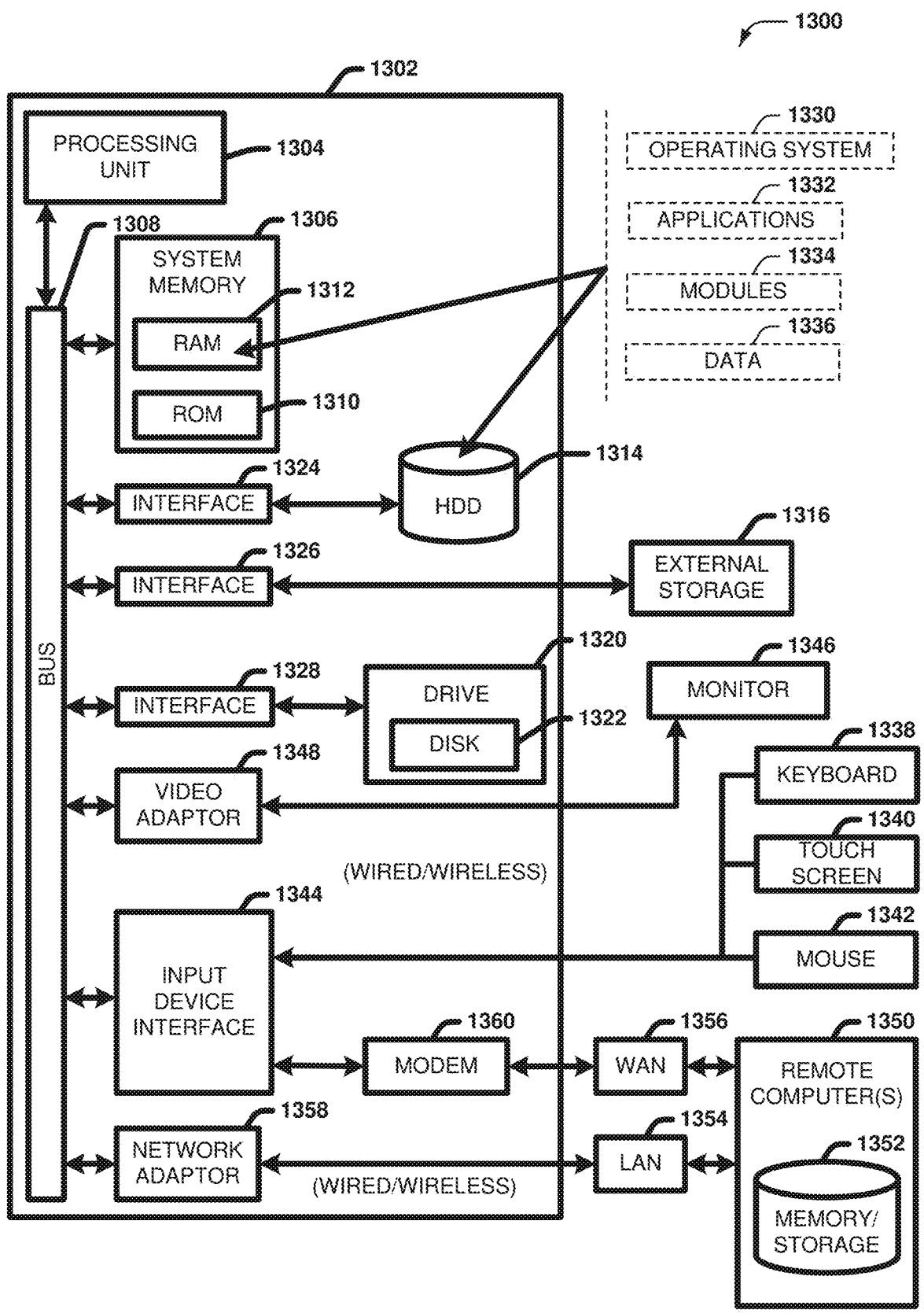
FIG. 13 illustrates a block diagram of an example, non-limiting operating environment in which one or more embodiments described herein can be facilitated.

In order to provide additional context for various embodiments described herein, FIG. 13 and the following discussion are intended to provide a general description of a suitable computing environment 1300 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 13, the example environment 1300 for implementing various embodiments of the aspects described herein includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes ROM 1310 and RAM 1312. A basic input/output system (BIOS) can be stored in a non-volatile memory such as ROM, erasable programmable read only memory (EPROM), EEPROM, which BIOS contains the basic routines that help to transfer information between elements within the computer 1302, such as during startup. The RAM 1312 can also include a high-speed RAM such as static RAM for caching data.

The computer 1302 further includes an internal hard disk drive (HDD) 1314 (e.g., EIDE, SATA), one or more external storage devices 1316 (e.g., a magnetic floppy disk drive (FDD) 1316, a memory stick or flash drive reader, a memory card reader, etc.) and a drive 1320, e.g., such as a solid state drive, an optical disk drive, which can read or write from a disk 1322, such as a CD-ROM disc, a DVD, a BD, etc. Alternatively, where a solid state drive is involved, disk 1322 would not be included, unless separate. While the internal HDD 1314 is illustrated as located within the computer 1302, the internal HDD 1314 can also be configured for external use in a suitable chassis (not shown). Additionally, while not shown in environment 1300, a solid state drive (SSD) could be used in addition to, or in place of, an HDD 1314. The HDD 1314, external storage device(s) 1316 and drive 1320 can be connected to the system bus 1308 by an HDD interface 1324, an external storage interface 1326 and a drive interface 1328, respectively. The interface 1324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. The systems and methods described herein can be implemented utilizing various commercially available operating systems or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In such an embodiment, operating system 1330 can comprise one virtual machine (VM) of multiple VMs hosted at computer 1302. Furthermore, operating system 1330 can provide runtime environments, such as the Java runtime environment or the .NET framework, for applications 1332. Runtime environments are consistent execution environments that allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and settings for an application.

Further, computer 1302 can be enable with a security module, such as a trusted processing module (TPM). For instance with a TPM, boot components hash next in time boot components, and wait for a match of results to secured values, before loading a next boot component. This process can take place at any layer in the code execution stack of computer 1302, e.g., applied at the application execution level or at the operating system (OS) kernel level, thereby enabling security at any level of code execution.

A user can enter commands and information into the computer 1302 through one or more wired/wireless input devices, e.g., a keyboard 1338, a touch screen 1340, and a pointing device, such as a mouse 1342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1304 through an input device interface 1344 that can be coupled to the system bus 1308, but can be connected by other interfaces, such as a parallel port, an IEEE 1394 serial port, a game port, a USB port, an IR interface, a BLUETOOTH® interface, etc.

A monitor 1346 or other type of display device can be also connected to the system bus 1308 via an interface, such as a video adapter 1348. In addition to the monitor 1346, a computer typically includes other peripheral output devices (not shown), such as speakers, printers, etc.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1352 is illustrated. The logical connections depicted include wired/wireless connectivity to a local area network (LAN) 1354 and/or larger networks, e.g., a wide area network (WAN) 1356. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired or wireless communication to the LAN 1354, which can also include a wireless access point (AP) disposed thereon for communicating with the adapter 1358 in a wireless mode.

When used in a WAN networking environment, the computer 1302 can include a modem 1360 or can be connected to a communications server on the WAN 1356 via other means for establishing communications over the WAN 1356, such as by way of the Internet. The modem 1360, which can be internal or external and a wired or wireless device, can be connected to the system bus 1308 via the input device interface 1344. In a networked environment, program modules depicted relative to the computer 1302 or portions thereof, can be stored in the remote memory/storage device 1352. It will be appreciated that the network connections shown are example and other means of establishing a communications link between the computers can be used.

When used in either a LAN or WAN networking environment, the computer 1302 can access cloud storage systems or other network-based storage systems in addition to, or in place of, external storage devices 1316 as described above, such as but not limited to a network virtual machine providing one or more aspects of storage or processing of information. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a standalone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
forming a tunnel barrier of a Josephson junction on a substrate during a shadow evaporation process, wherein the tunnel barrier is sandwiched between two superconductors; and
etching an exposed portion of the tunnel barrier during the shadow evaporation process, wherein the shadow evaporation process comprises:
patterning a resist stack onto the substrate, wherein the etching the exposed portion of the tunnel barrier leaves a protected portion of the tunnel barrier within a shadow of the resist stack, wherein the two superconductors comprise a first superconductor having a first superconducting material and a second superconductor having a second superconducting material and wherein the shadow evaporation process further comprises:
depositing the first superconducting material on the substrate after the patterning the resist stack;
oxidizing a surface of the first superconducting material to form the tunnel barrier; and
depositing the second superconducting material over the protected portion of the tunnel barrier to form the Josephson junction, wherein the etching the exposed portion of the tunnel barrier occurs after the oxidizing the surface of the first superconducting material and before the depositing the second superconducting material.

2. The method of claim 1, wherein the resist stack includes a suspended resist bridge, and wherein the protected portion of the tunnel barrier is beneath the suspended resist bridge.

3. The method of claim 1, wherein the etching the exposed portion of the tunnel barrier employs ion milling.

4. The method of claim 3, wherein a duration of the oxidizing the surface of the first superconducting material is based on a duration of the ion milling.

5. The method of claim 3, wherein the shadow evaporation process is a Dolan double angle evaporation technique, and wherein the ion milling is performed in a top-down direction.

6. A method, comprising:
patterning a bi-layer resist stack on a substrate;
forming a junction barrier layer on a first superconductor on the substrate during a shadow evaporation technique; and
directionally etching a first portion of the junction barrier layer during the shadow evaporation technique, the first portion being outside of a shadow cast by the bi-layer resist stack, wherein the junction barrier layer is disposed between the first superconductor and a second superconductor, wherein the shadow evaporation technique comprises:
evaporating the first superconductor onto the substrate;
oxidizing a surface of the first superconductor to form the junction barrier layer; and
evaporating the second superconductor over the second portion of the junction barrier layer, wherein directionally etching the first portion of the junction barrier layer occurs after the oxidizing the surface of the first superconductor and before the evaporating the second superconductor.

7. The method of claim 6, wherein the directionally etching the first portion of the junction barrier layer causes a second portion of the junction barrier layer to remain on the first superconductor, the second portion being inside the shadow cast by the bi-layer resist stack.

8. The method of claim 7, wherein the bi-layer resist stack includes a bridge, and wherein the second portion of the junction barrier layer lies beneath the bridge.

9. The method of claim 6, wherein the directionally etching the first portion of the junction barrier layer employs ion milling.

10. The method of claim 9, wherein a duration of the oxidizing the surface of the first superconductor is based on a duration of the ion milling.

11. The method of claim 9, wherein the shadow evaporation technique is a Dolan double evaporation technique, and wherein the ion milling is performed in a top-down direction.

* * * * *